(12) United States Patent
Kim

(10) Patent No.: US 8,673,688 B2
(45) Date of Patent: Mar. 18, 2014

(54) SEMICONDUCTOR PACKAGE AND METHOD OF MANUFACTURING THE SAME

(75) Inventor: Wonkeun Kim, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 41 days.

(21) Appl. No.: 13/227,889

(22) Filed: Sep. 8, 2011

(65) Prior Publication Data
US 2012/0100671 A1    Apr. 26, 2012

(30) Foreign Application Priority Data

Oct. 20, 2010  (KR) .................. 10-2010-0102563

(51) Int. Cl.
*H01L 21/00*    (2006.01)
(52) U.S. Cl.
USPC ........... 438/118; 438/106; 438/108; 438/109; 257/E21.001
(58) Field of Classification Search
USPC .................................. 438/108; 257/E21.001
See application file for complete search history.

(56) References Cited

U.S. PATENT DOCUMENTS

| | | | |
|---|---|---|---|
| 2006/0055028 A1* | 3/2006 | Hasunuma | 257/706 |
| 2006/0231949 A1* | 10/2006 | Park et al. | 257/737 |
| 2008/0017995 A1 | 1/2008 | Karashima et al. | |
| 2008/0311701 A1* | 12/2008 | Yang | 438/108 |
| 2009/0085227 A1 | 4/2009 | Shiraishi et al. | |
| 2010/0052189 A1* | 3/2010 | Sakurai et al. | 257/778 |
| 2012/0098123 A1* | 4/2012 | Yu et al. | 257/737 |

FOREIGN PATENT DOCUMENTS

| | | |
|---|---|---|
| JP | 3955302 B2 | 4/2006 |
| JP | 2008078238 A | 4/2008 |
| JP | 4402718 B2 | 1/2010 |
| KR | 20070052791 A | 5/2007 |
| WO | WO-2006030674 A1 | 3/2006 |
| WO | WO-2006123554 A1 | 11/2006 |

* cited by examiner

*Primary Examiner* — Angel Roman
(74) *Attorney, Agent, or Firm* — Harness, Dickey & Pierce, P.L.C.

(57) ABSTRACT

A semiconductor package includes a circuit substrate, a semiconductor chip on the circuit substrate, an inner solder ball between the circuit substrate and the semiconductor chip, and dummy solder filling a dummy opening in at least one of an substrate insulation layer of the circuit substrate and a chip insulation layer. The dummy solder does not electrically connect the semiconductor chip with the substrate. The circuit substrate may include a base substrate, a substrate connection terminal on the base substrate, and the substrate insulation layer covering the base substrate. The semiconductor chip may include a chip connection terminal and the chip insulation layer exposing the chip connection terminal. The inner solder ball may be interposed between the substrate connection terminal and the chip connection terminal to electrically connect the circuit substrate to the semiconductor chip.

19 Claims, 32 Drawing Sheets

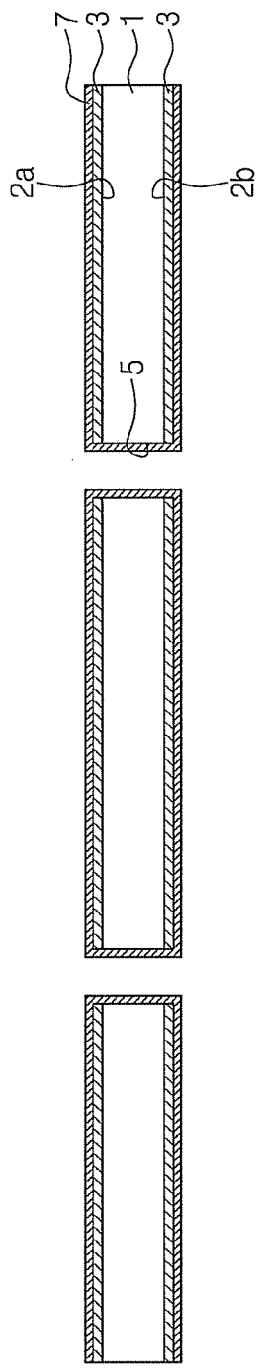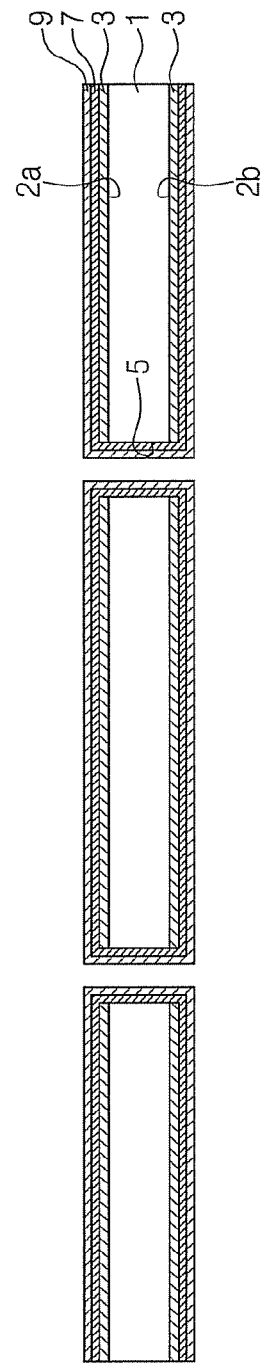

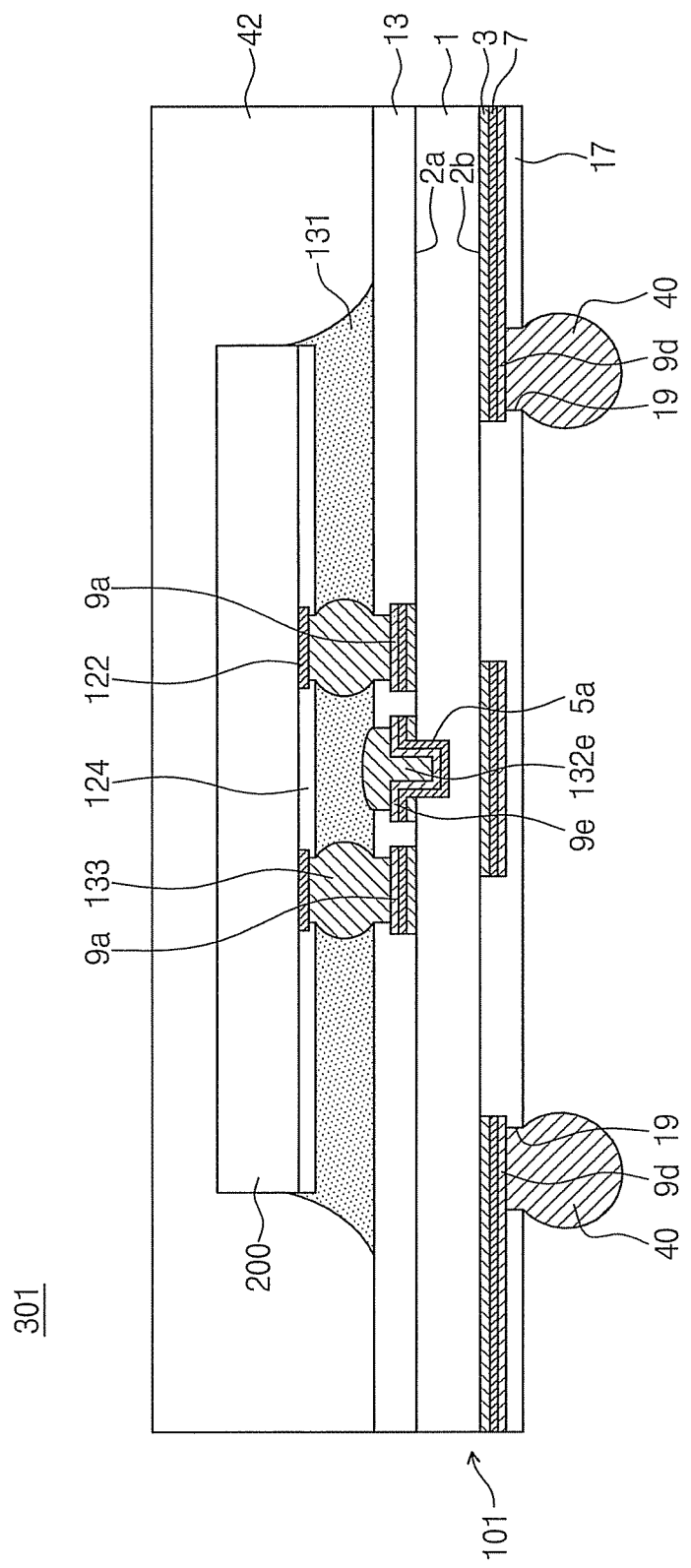

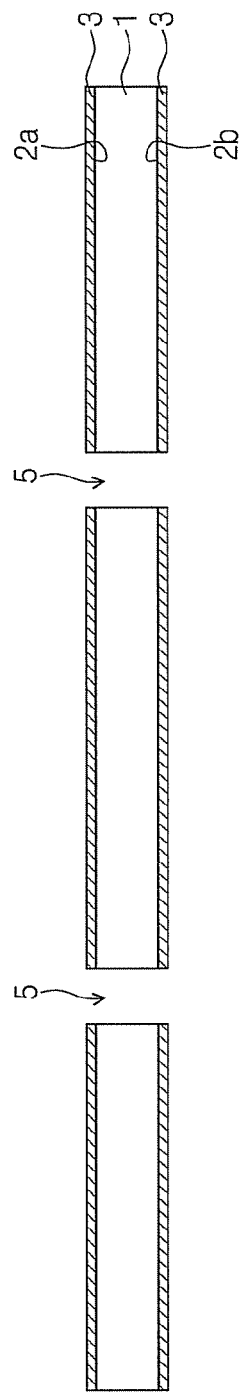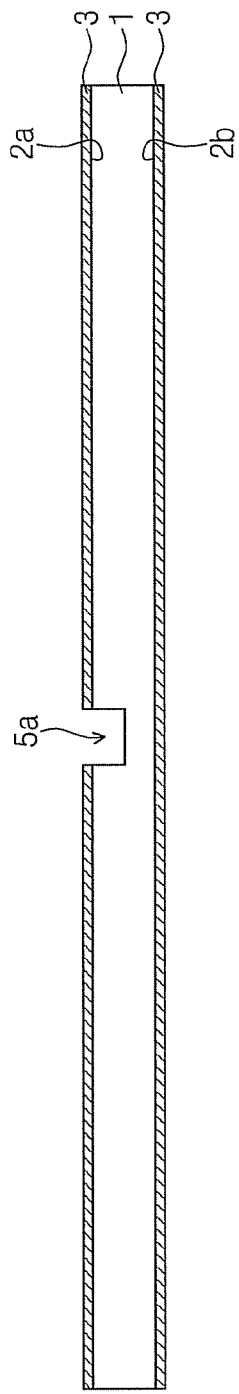

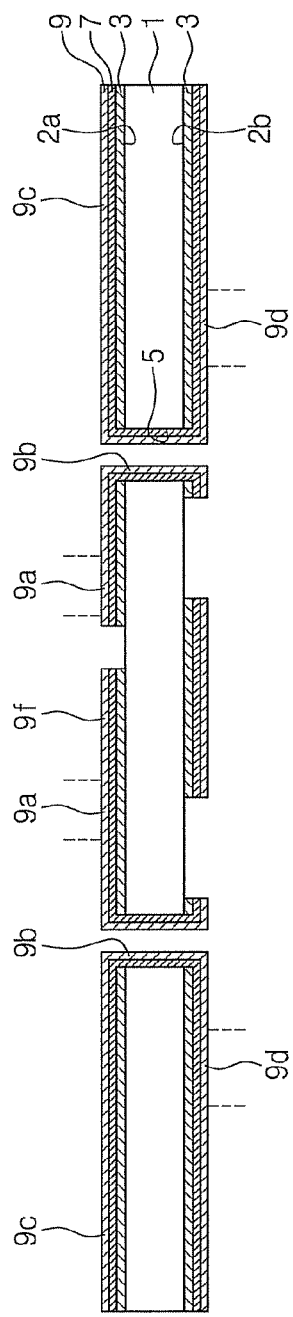
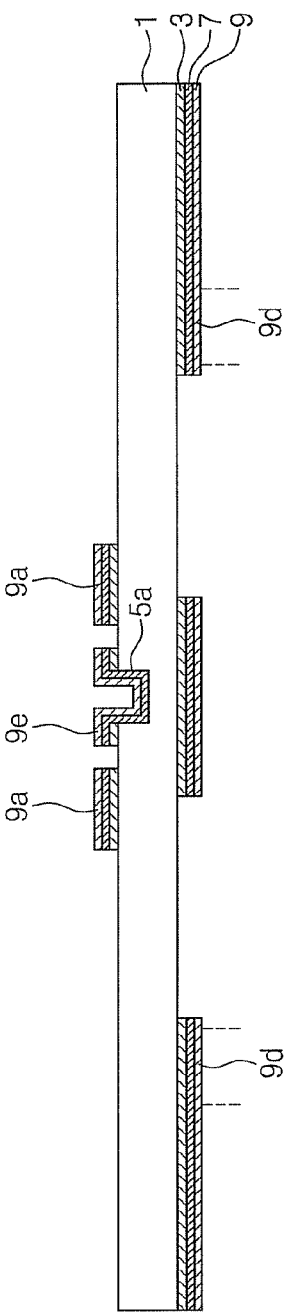
Fig. 17A
Fig. 17B

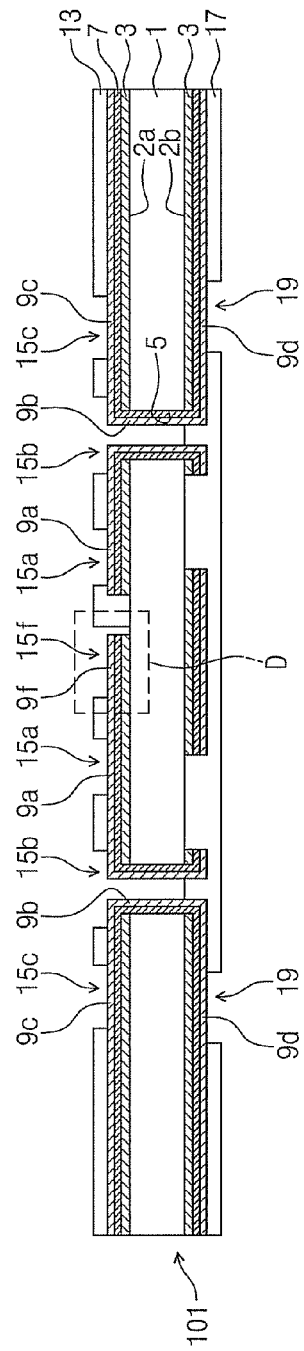
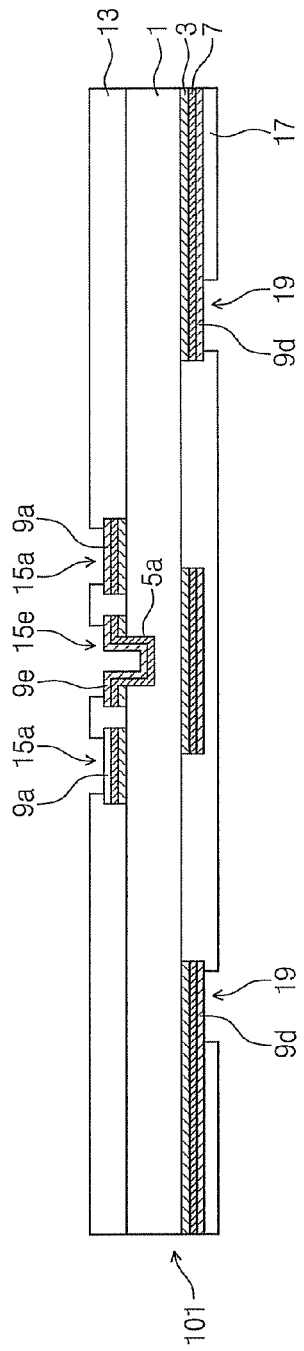
Fig. 18A
Fig. 18B

SEMICONDUCTOR PACKAGE AND METHOD OF MANUFACTURING THE SAME

CROSS-REFERENCE TO RELATED APPLICATIONS

This U.S. non-provisional patent application claims priority under 35 U.S.C. §119 of Korean Patent Application No. 10-2010-0102563, filed on Oct. 20, 2010, the entire contents of which are hereby incorporated by reference.

BACKGROUND

The present disclosure herein relates to a semiconductor package and a method of manufacturing the same.

As a semiconductor integrated circuit used in an electronic device becomes denser and highly integrated, a tendency for a multi pin and a narrow pitch of an electrode terminal in a semiconductor chip becomes stronger rapidly. Moreover, flip chip bonding mounting is extensively used for reducing wiring delay as a semiconductor chip is mounted on a circuit substrate (or a wiring substrate). More reliable and simpler flip chip bonding mounting methods are diversely studied in relation to a manufacturing method of a semiconductor package.

SUMMARY

The present disclosure provides a reliable semiconductor package.

The present disclosure also provides a reliable manufacturing method of a semiconductor package.

Some example embodiments of the inventive concepts provide semiconductor packages. One example embodiment includes a circuit substrate including a base substrate. A substrate connection terminal is on the base substrate, and a substrate insulation layer on the base substrate exposes the substrate connection terminal. The package further includes a first semiconductor chip, which includes a chip connection terminal and a chip insulation layer. The chip insulation layer exposes the chip connection terminal and is mounted on the circuit substrate. An inner solder ball is between the substrate connection terminal and the chip connection terminal. The inner solder ball electrically connects the substrate connection terminal to the chip connection terminal. A dummy solder fills a dummy opening in at least one of the substrate insulation layer and the chip insulation layer. The dummy solder does not electrically connect the semiconductor chip with the substrate.

In some example embodiments, the circuit substrate may further include a via metal pattern on an inner sidewall of a via hole that penetrates. A dummy opening is in the substrate insulation layer and exposes the via metal pattern, and the dummy solder contacts the via metal pattern and at least partially fills the via hole.

In other example embodiments, the circuit substrate may further include a circuit metal pattern electrically connected to the substrate connection terminal. The substrate insulation layer includes the dummy opening, which exposes the circuit metal pattern.

In still other example embodiments, a width of the dummy opening greater than a width of the circuit metal pattern.

In even other example embodiments, the circuit substrate may further include a substrate dummy metal pattern. The substrate insulation layer includes the dummy opening, which may expose the substrate dummy metal pattern. The dummy solder may contact the dummy metal pattern.

In yet other example embodiments, a width of the dummy opening may be greater than a width of the substrate dummy metal pattern.

In further example embodiments, the circuit substrate may further include a recess metal pattern on a sidewall and a bottom of a recessed region of the circuit substrate. The substrate insulation layer includes the dummy opening, which exposes the recess metal pattern. The dummy solder contacts the recess metal pattern and at least partially fills the recessed region.

In still further example embodiments, the semiconductor chip may further include a chip dummy metal pattern, and a dummy opening is in the chip insulation layer. The dummy opening exposes the chip dummy metal pattern, and the dummy solder contacts the chip dummy metal pattern.

In even further example embodiments, the first semiconductor chip may further include a bump on the chip connection terminal, and the inner solder ball may cover at least a side of the bump.

In yet further example embodiments, the semiconductor chip may further include a through via penetrating the first semiconductor chip.

In yet further example embodiments, the semiconductor package may further include a second semiconductor chip mounted on the first semiconductor chip and connected electrically to the through via.

Other example embodiments of the inventive concepts are directed to methods of manufacturing a semiconductor package. One embodiment of the method includes forming a circuit substrate including a base substrate. A substrate connection terminal is on the base substrate, and a substrate insulation layer covers the base substrate and exposes the substrate connection terminal. A mixture layer is formed on the circuit substrate and includes an adhesive resin and a solder particle. A first semiconductor chip is provided on the mixture layer. The first semiconductor chip includes a chip connection terminal and a chip insulation layer, which exposes the chip connection terminal. The method further includes forming an inner solder ball between the substrate connection terminal and the chip connection terminal, and forming dummy solder in a dummy opening. The dummy opening is in one of the substrate insulation layer and the chip insulation layer.

In some example embodiments, the solder particles are dispersed in the adhesive resin.

In other example embodiments, the forming the mixture layer may include providing a mixed multilayer including an adhesive resin layer formed of the adhesive resin and a solder particle layer formed of the solder particles.

In still other example embodiments, the forming of the inner solder ball may include heating with the mixture layer to a temperature of more than a melting point of the solder particles.

In even other example embodiments, the forming of the circuit substrate may include preparing the base substrate; forming the substrate connection terminal on the base substrate; and forming the substrate insulation layer on the base substrate such that the substrate insulation layer exposes the substrate connection terminal.

In yet other example embodiments, the methods may further include forming a circuit metal pattern on the base substrate. The substrate insulation layer includes a dummy opening exposing the circuit metal pattern.

In further example embodiments, the dummy opening has a width greater than a width of the circuit metal pattern.

In still further example embodiments, the methods may further include forming a via hole by patterning the base substrate, and forming a via metal pattern on a sidewall of the via hole, wherein the substrate insulation layer includes a dummy opening exposing the via metal pattern.

In even further example embodiments, the methods may further include forming a recessed region in the base substrate, and forming a recess metal pattern covering a sidewall and a bottom of the recessed region, wherein the substrate insulation layer is formed to have a dummy opening exposing the recess metal pattern.

In yet further example embodiments, the methods may further include forming a substrate dummy metal pattern on the base substrate, wherein the substrate insulation layer is formed to have a dummy opening exposing the substrate dummy metal pattern.

In yet further example embodiments, the dummy opening has a width greater than a width of the substrate dummy metal pattern.

In yet further example embodiments, the methods may further include forming an upper mixture layer on the first semiconductor chip; and providing a second semiconductor chip on the upper mixture layer. The second semiconductor chip includes an upper chip connection terminal and an upper chip insulation layer exposing the upper chip connection terminal. An upper inner solder ball is formed between the chip connection terminal and the upper chip connection terminal.

In yet further example embodiments, the forming of the inner solder ball and the forming of the upper inner solder ball may be performed simultaneously.

In a further embodiment of the method, the method includes forming at least one dummy opening in at least one of an insulation layer of a semiconductor chip and an insulation layer of a substrate. An inner solder ball is formed between the substrate and the semiconductor chip. The inner solder ball electrically connects a chip connecting terminal of the semiconductor chip to a substrate connection terminal of the substrate. A dummy solder is formed in the at least one dummy opening, and the dummy solder does not electrically connect the substrate to the semiconductor chip.

In one embodiment, the method further includes forming at least one of a circuit metal pattern, a via metal pattern, and a dummy substrate metal pattern on the substrate; wherein the at least one dummy opening is formed to expose at least one of the circuit metal pattern, the via metal pattern, and the dummy substrate metal pattern.

In one embodiment, the method further includes forming a circuit metal pattern, a via metal pattern, and a dummy substrate metal pattern on the substrate; wherein the at least one dummy opening is a plurality of dummy openings formed to expose the circuit metal pattern, the via metal pattern, and the dummy substrate metal pattern.

In one embodiment, the method further includes forming a mixture layer on the substrate. The mixture layer includes an adhesive resin and a plurality of solder particles, and the inner solder ball and the dummy solder are simultaneously formed by heating the mixture layer.

In one embodiment, the solder particles may be dispersed in the adhesive resin.

In one embodiment, the forming the mixture layer includes providing a mixed multilayer having an adhesive resin layer formed of the adhesive resin and a solder particle layer formed of the solder particles.

BRIEF DESCRIPTION OF THE DRAWINGS

The accompanying drawings are included to provide a further understanding of the inventive concepts, and are incorporated in and constitute a part of this specification. The drawings illustrate example embodiments of the inventive concepts and, together with the description, serve to explain principles of the inventive concepts. In the drawings:

FIGS. 3 through 8, 9A, 10A, and 12 are manufacturing sectional views illustrating sequential manufacturing processes of a semiconductor package having a section of FIG. 2 according to an example embodiment of the inventive concepts;

FIG. 14B is a sectional view taken along the line XIVB-XIVB' of FIG. 13.

FIGS. 15A through 19A are manufacturing sectional views illustrating sequential manufacturing processes of a semiconductor package having a section of FIG. 14A;

FIGS. 15B through 19B are manufacturing sectional views illustrating sequential manufacturing processes of a semiconductor package having a section of FIG. 14B;

DETAILED DESCRIPTION OF THE EMBODIMENTS

Figure 1:
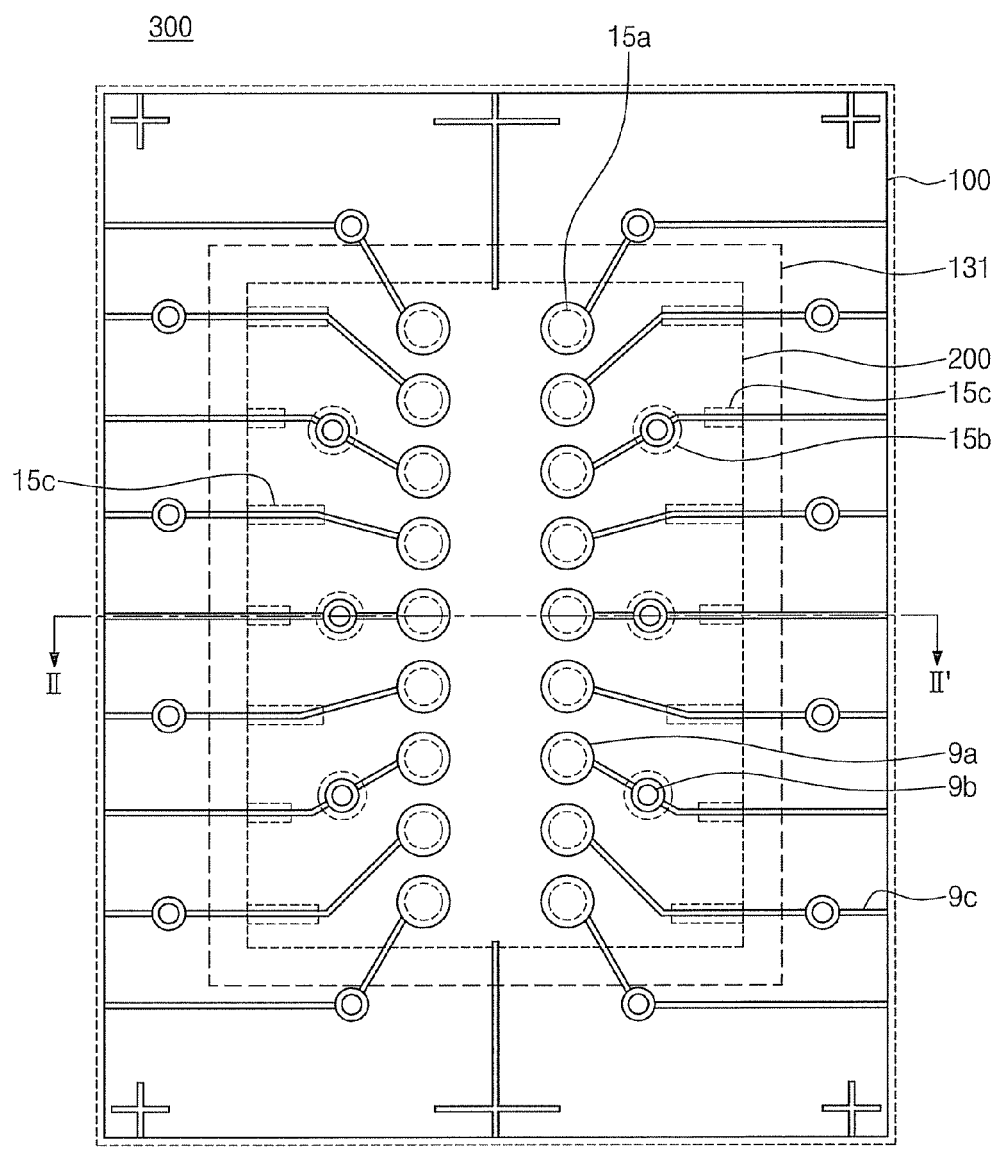
FIG. 1 is a plan view of a semiconductor package according to a first example embodiment of the inventive concepts.

Example embodiments will be described more fully hereinafter with reference to the accompanying drawings, in which example embodiments are shown. The present invention may, however, be embodied in many different forms and should not be construed as limited to example embodiments as set forth herein. Rather, example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers that may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the inventive concepts will be described below in more detail with reference to the accompanying drawings. The inventive concepts may, however, be embodied in different forms and should not be construed as limited to the example embodiments set forth herein. Rather, these example embodiments are provided so that this disclosure will be thorough and complete, and will fully convey the scope of the inventive concepts to those skilled in the art. In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Embodiment 1

Figure 2:
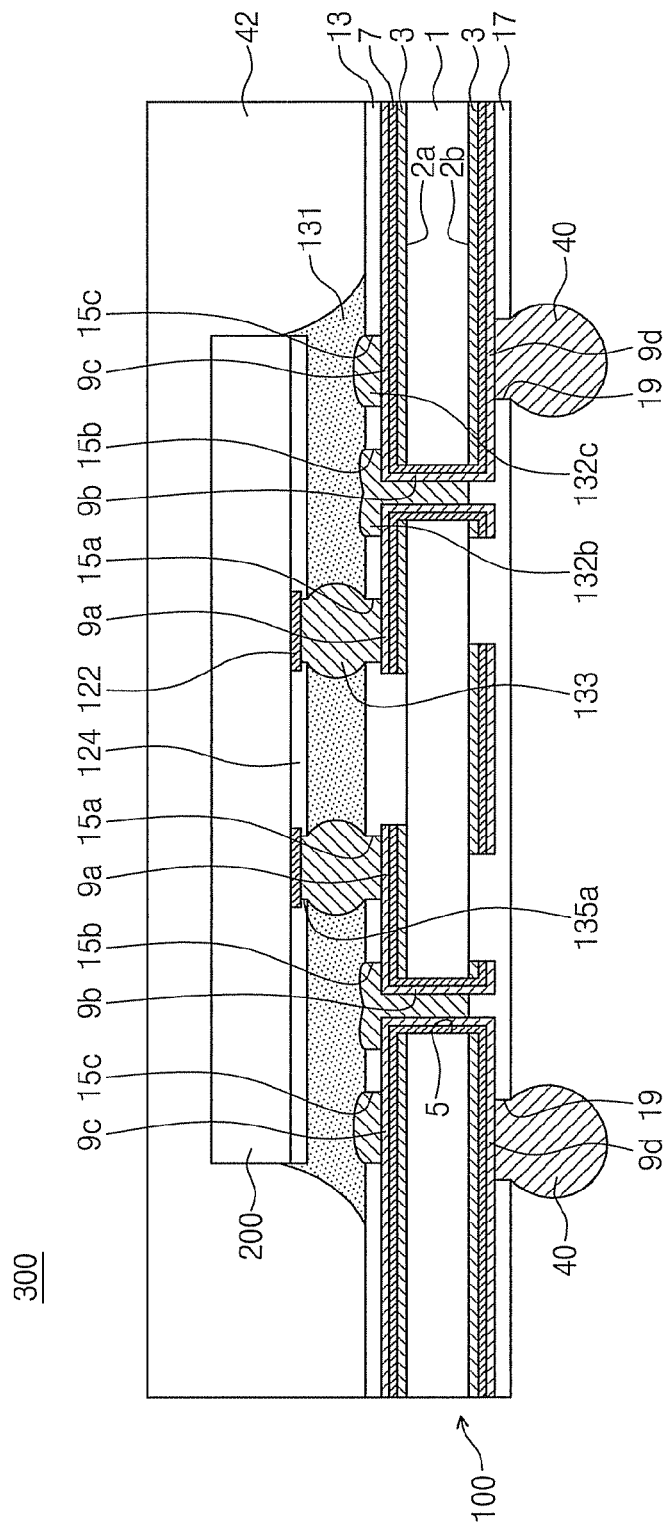
FIG. 2 is a sectional view taken along the line II-II' of FIG. 1.

FIG. 1 is a plan view of a semiconductor package according to a first example embodiment (embodiment 1) of the inventive concepts. FIG. 2 is a sectional view taken along the line II-II' of FIG. 1.

Referring to FIGS. 1 and 2, the semiconductor package 300 of the embodiment 1 includes a circuit substrate 100 and a semiconductor chip 200 mounted thereon. The circuit substrate 100 includes a base substrate 1. The base substrate 1 may be formed of Bismaleimide triazine resin, alumina based ceramic, glass based ceramic, or silicon.

The base substrate 1 includes a first side 2a and a second side 2b facing the first side 2a. The base substrate 1 includes a via hole 5 penetrating the first side 2a and the second side 2b. A metal plate 3 is disposed on the first side 2a and the second side 2b, and a seed layer 7 is disposed on the metal plate 3 and the via hole 5. The metal plate 3 may be a copper plate. For example, the seed layer 7 may be formed of an electroless plating pattern. Electro plating patterns 9a, 9b, 9c, and 9d are disposed on the seed layer 7. The plating patterns 9a, 9b, 9c, and 9d may include a substrate connection terminal 9a, a via metal pattern 9b, a circuit metal pattern 9c, and a ball land 9d. The substrate connection terminal 9a is disposed on the first side 2a and is electrically connected to a chip connection terminal 122 of a semiconductor chip 200. The via metal pattern 9b is disposed to cover an inner sidewall of the via hole 5. The circuit metal pattern 9c is disposed on the first side 2a and is electrically connected to the substrate connection terminal 9a to deliver a signal. The ball land 9d is disposed on the second side 2b and an external solder ball 40 is attached on the ball land 9d. The seed layer 7 and the electro plating patterns 9a, 9b, 9c, and 9d may include copper. A first substrate insulation layer 13 is disposed on the first side 2a and a second substrate insulation layer 17 is disposed on the second side 2b. The first substrate insulation layer 13 and the second substrate insulation layer 17 may correspond to a solder resist layer and may be formed of a photo sensitive photoresist layer. The first substrate insulation layer 13 includes a substrate connection terminal opening 15a exposing the substrate connection terminal 9a. The first substrate insulation layer 13 may further include dummy substrate openings 15b and 15c. The dummy substrate openings 15b and 15c may include a via dummy opening 15b and a circuit dummy opening 15c, which expose predetermined portions of the via metal pattern 9b and the circuit metal pattern 9c, respectively. The circuit dummy opening 15c of this example embodiment has a rectangular line form on a plane but the inventive concepts is not limited thereto and thus the circuit dummy opening 15c may have various plane forms along the circuit metal pattern 9c. The second substrate insulation layer 17 may include a ball land opening 19 exposing the ball land 9d. The dummy substrate openings 15b and 15c are filled with dummy solders 132b and 132c. The dummy solders 132b and 132c include a via dummy solder 132b and a circuit dummy solder 132c. The via dummy solder 132b fills the via dummy opening 15b and the circuit dummy solder 132c fills the circuit dummy opening 15c.

The semiconductor chip 200 is disposed on the circuit substrate 100. A chip connection terminal 122 is disposed at the bottom surface of the semiconductor chip 200. A chip insulation layer 124 with a chip connection terminal opening 135a exposing the chip connection terminal 122 is provided at the bottom surface of the semiconductor chip 200. The chip connection terminal 122 is disposed at a portion overlapping the substrate connection terminal 9a. An inner solder ball 133 is disposed between the chip connection terminal 122 and the substrate connection terminal 9a so that it electrically connects the chip connection terminal 122 with the substrate connection terminal 9a. The dummy solders 132b and 132c may be formed of the same material as the inner solder ball 133, which may be metals such as Pb, Sn, In, Bi, Sb, Ag, or combinations thereof. A resin layer 131 is disposed between the chip insulation layer 124 and the first substrate insulation layer 13 to protect the inner solder ball 133. No opening is provided in the chip insulation layer 124 at a position that the dummy solders 132b and 132c overlap. A molding layer 42 may cover the semiconductor chip 200 on the circuit substrate 100.

FIGS. 3 through 8, 9A, 10A, and 12 are manufacturing sectional views illustrating sequential manufacturing processes of a semiconductor package having a section of FIG. 2 according to an example embodiment of the inventive concepts.

Figure 3:
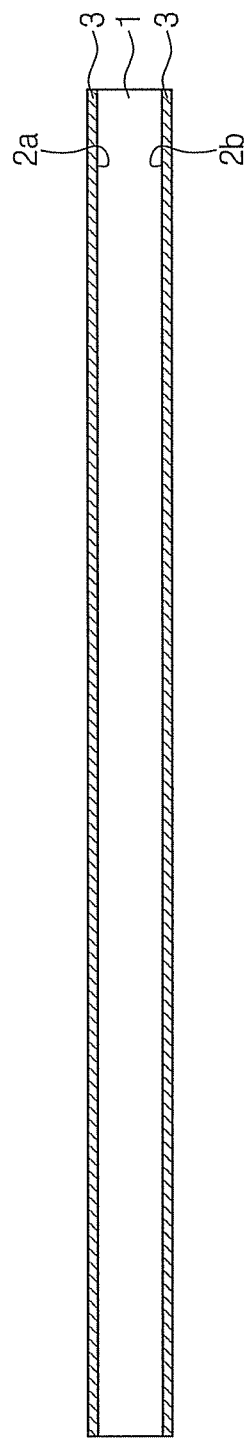

Referring to FIG. 3, a base substrate 1 having a first side 2a and a second side 2b facing the first side 2a is prepared. A metal plate 3 is stacked on the first side 2a and the second side 2b of the base substrate 1. The metal plate 3 may be fixed on the base substrate 1 through a bonding and/or compression method. The metal plate 3 may be a copper plate. A half-etching process may be performed to reduce a thickness of the metal plate 3.

Figure 4:
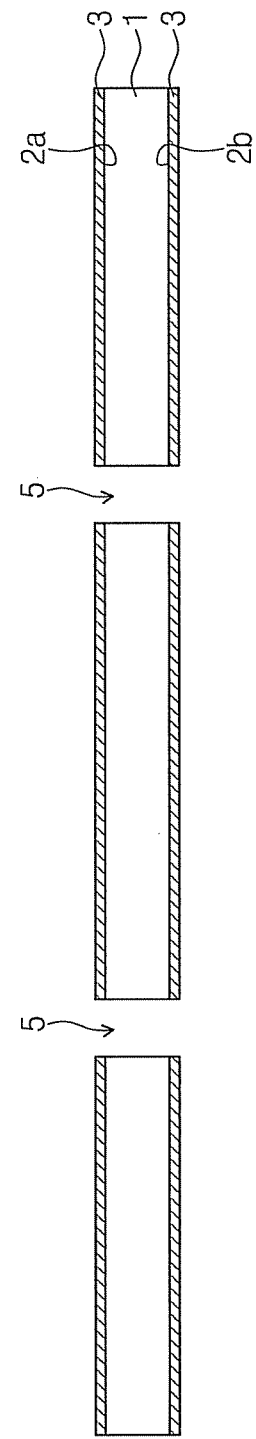

Referring to FIG. 4, a via hole 5 penetrating the metal plate 3 and the base substrate 1 is formed through an etching and drill process.

Referring to FIG. 5, a seed layer 7 is formed on the base substrate 1 having the via hole 5. The seed layer 7 may be formed through an electroless plating method. The seed layer 7 may include copper. The seed layer 7 is formed to cover the metal plate 3 on the first side 2a and the second side 2b and an inner sidewall of the via hole 5.

Referring to FIG. 6, an electro plating layer 9 is formed on the seed layer 7. The electro plating layer 9 may be formed through an electro plating method. The electro plating layer 9 may include copper. The electro plating layer 9 is formed on the seed layer 7 so that it is formed on an inner sidewall of the via hole 5.

Figure 7:
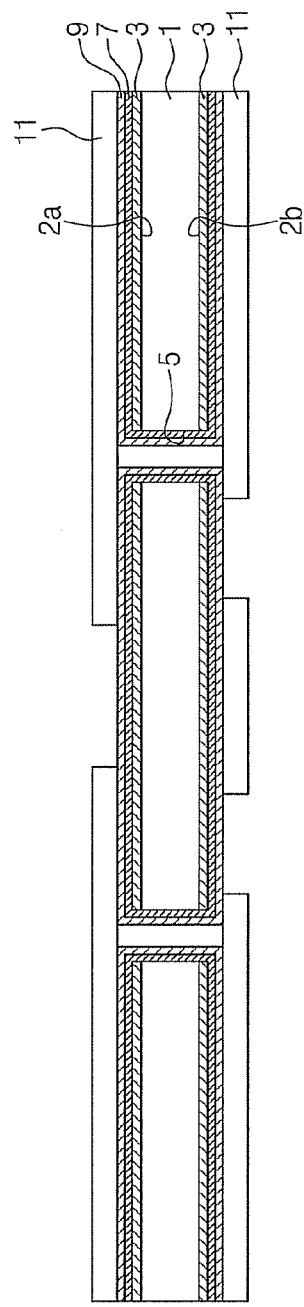

Referring to FIG. 7, a dry film is covered on the electro plating layer 9 and exposure and development processes are performed thereon to form a dry film mask 11. The dry film mask 11 may be formed to cover the via hole 5.

Figure 8:
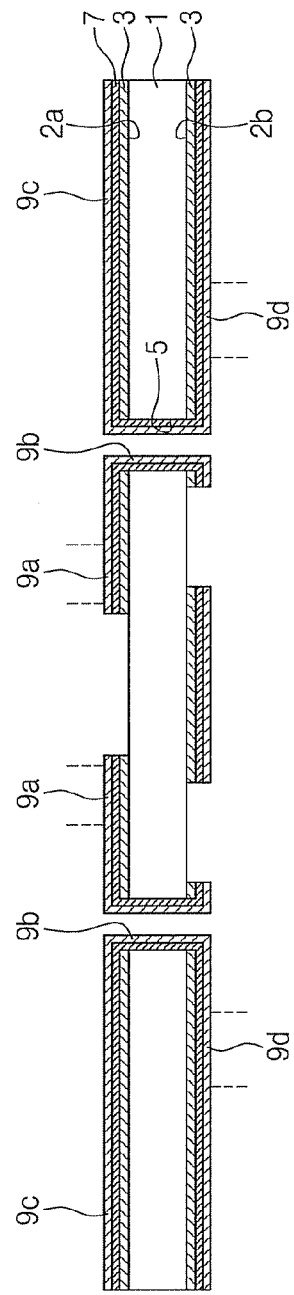

Referring to FIG. 8, by using the dry film mask 11 as an etch mask and etching the electro plating layer 9 therebelow, a substrate connection terminal 9a, a via metal pattern 9b, a circuit metal pattern 9c, and a ball land 9d are formed. The seed layer 7 and the metal plate 3 below the electrode plating layer 9 are etched simultaneously, so that a surface of the base substrate 1 is exposed. Then, the dry film mask 11 is removed. The dry film mask 11 may be removed through a wet etching method.

Figure 9A:
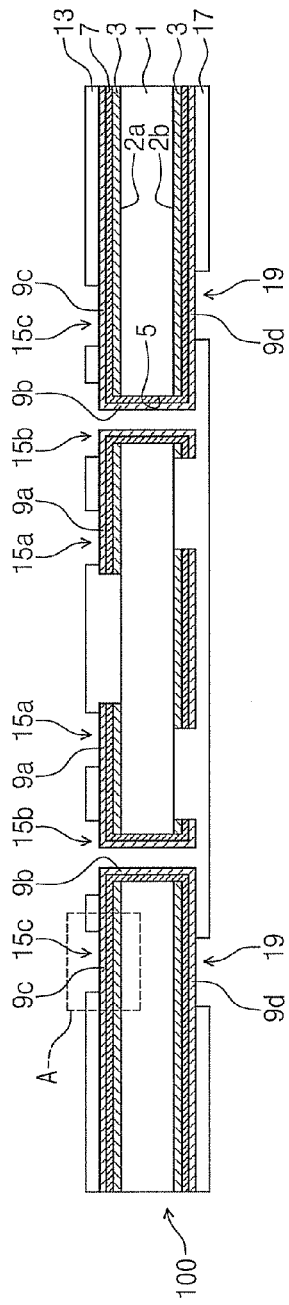
Figure 9B:
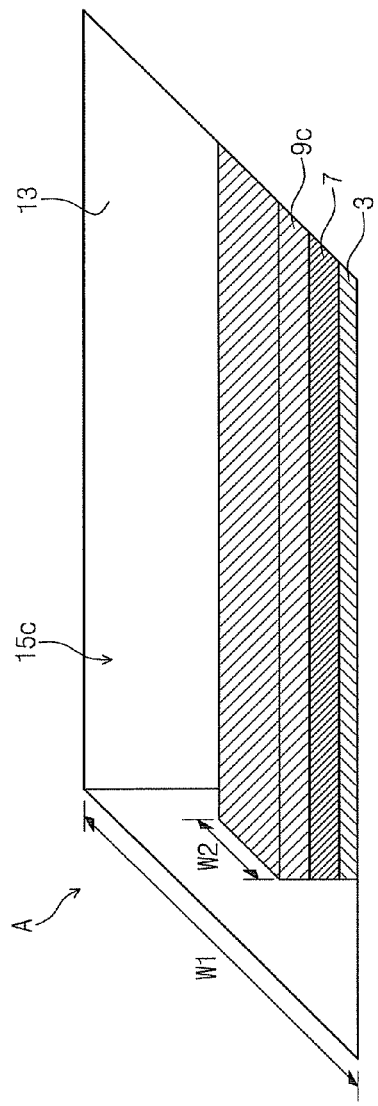
FIG. 9B is an enlarged perspective view of a portion A of FIG. 9A.

FIG. 9B is an enlarged perspective view of a portion A of FIG. 9A.

Referring to FIGS. 9A and 9B, a first substrate insulation layer 13 is formed on the first side 2a of the base substrate 1 and a second substrate insulation layer 17 is formed on the second side 2b. The substrate insulation layers 13 and 17 as a solder resist layer may be formed of a photo sensitive photoresist and also may be formed through a photolithography process. The first substrate insulation layer 13 is formed to have a substrate connection terminal opening 15a exposing the substrate connection terminal 9a. The first substrate insulation layer 13 is formed to include dummy substrate openings 15b and 15c. The dummy substrate openings 15b and 15c may include a via dummy opening 15b and a circuit dummy opening 15c exposing predetermined portions of the via metal pattern 9b and the circuit metal pattern 9c, respectively. The circuit dummy opening 15c may be formed to have a width W1 that is broader than a width W2 of the circuit metal pattern 9c as shown in FIG. 9B. Accordingly, a surface of the base substrate 1 adjacent to both sidewalls of the circuit metal pattern 9c may be exposed through the circuit dummy opening 15c. Additionally, the both sides of the circuit metal pattern 9c may be exposed. A ball land opening 19 exposing the ball land 9d may be formed in the second substrate insulation layer 17. Thus, a circuit substrate 10 may be completed.

Figure 10A:
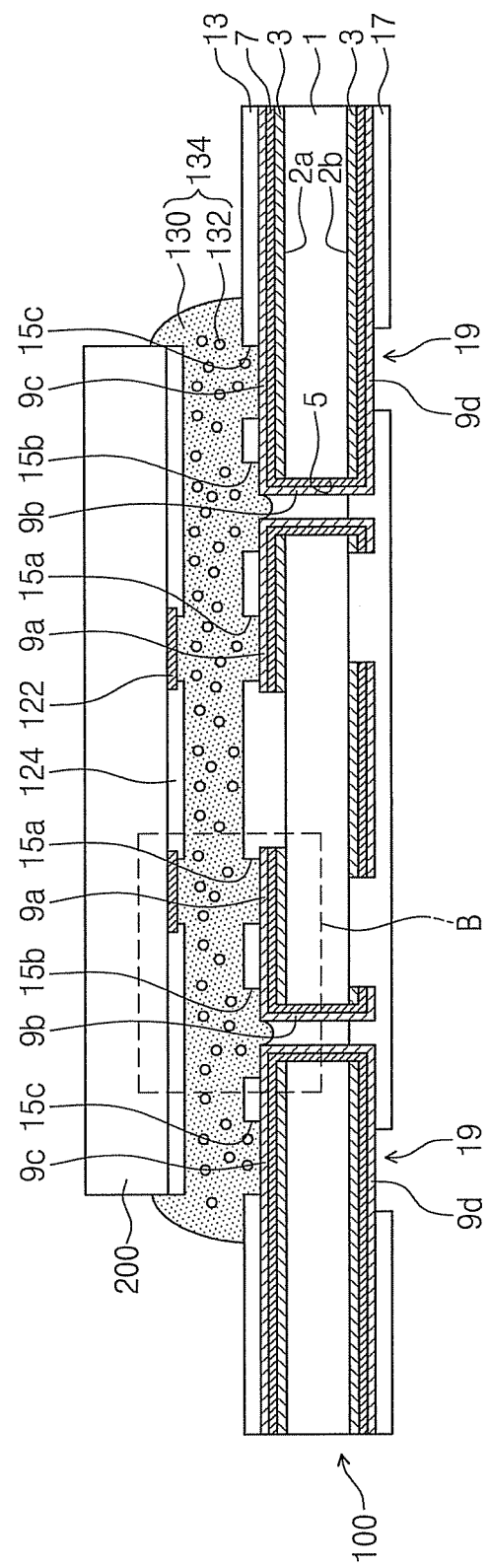
Figure 10B:
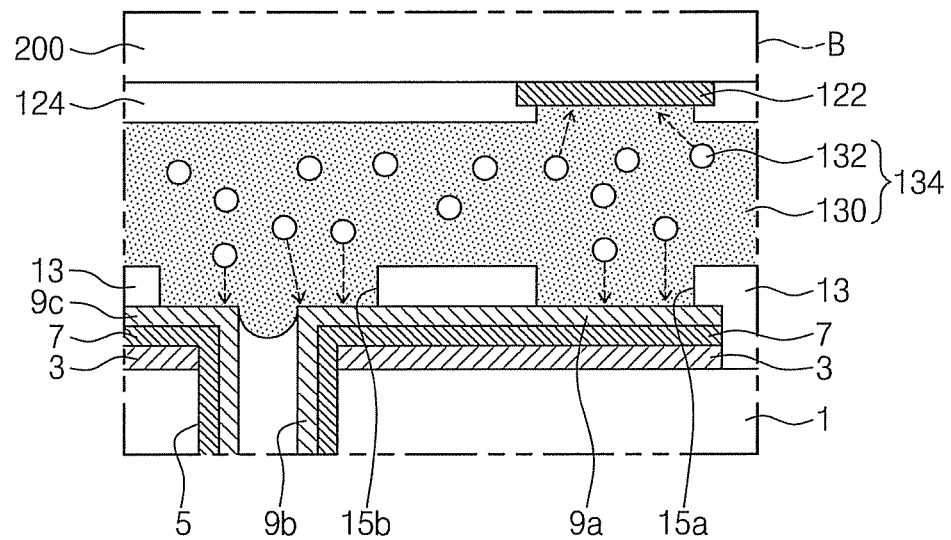
FIG. 10B is an enlarged sectional view of a portion B of FIG. 10A.

FIG. 10B is an enlarged sectional view of a portion B of FIG. 10A.

Figure 12:
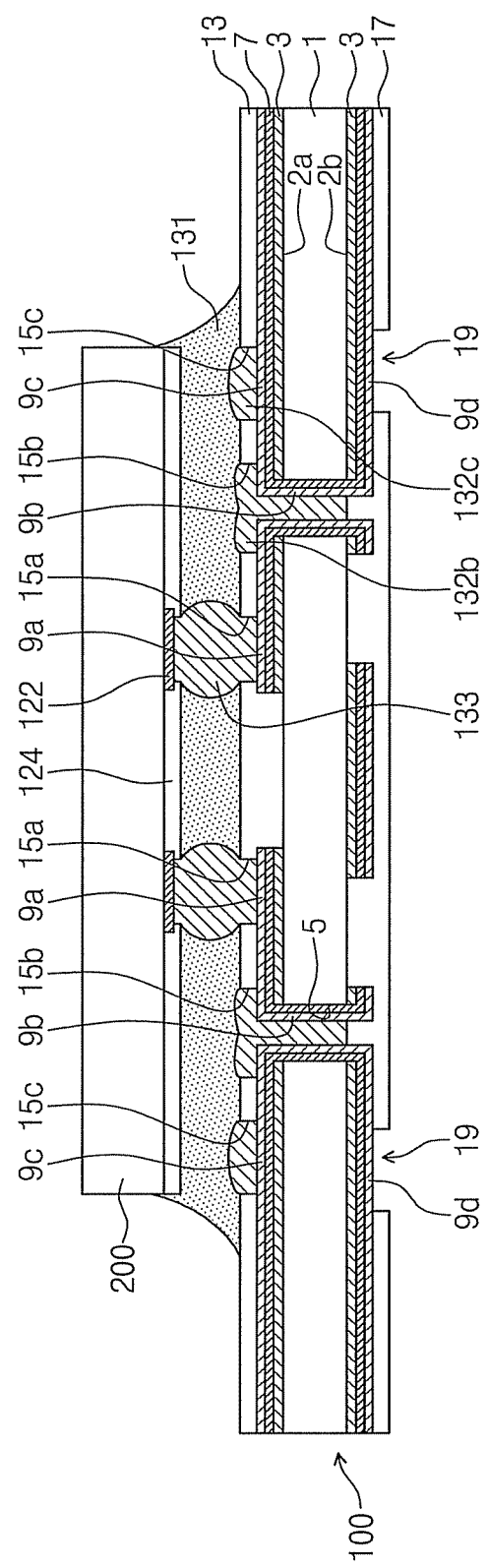

Referring to FIGS. 10A, 10B, and 12, a mixture 134 including a solder particle 132 and an adhesive resin 130 is applied on the circuit substrate 100. The solder particle 132 and the adhesive resin 130 may be mixed with a volume ratio of about 1:9 to about 5:5 in the mixture 134. For example, the solder particle 132 may have a diameter of about 0.1 μm to about 100 μm. The solder particle 132 may be a particle of metals such as Cu, Pb, Sn, In, Bi, Sb, Ag, and combinations thereof. The adhesive resin 130 may have a flux function. Once heated, the adhesive resin 130 may have a function for removing an oxide layer on a surface of the solder particle 132. The adhesive resin 130 may have an adhesive function. The adhesive resin 130 may be an epoxy based resin, for example and may include bisphenol A and epichlorohydrin as more detailed example. The mixture 134 may further include a reductant, a deforming agent, a solvent and/or a hardener. The hardener may be silicon base, phenol base, acid anhydride base, and amine base. The mixture 134 may further include a thermal setting agent, a thermal plastic agent and/or a UV hardening material.

Like the above, after the mixture 134 is applied, a semiconductor chip 200 is provided on the mixture 134. Then, the circuit substrate 100 is heated. At this point, the circuit substrate 100 is heated at a temperature of more than a melting point of the solder particle 132. The heated adhesive resin 130 may remove an oxide layer on a surface of the solder particle 132. Moreover, the mixture 134 may include a deforming agent, the deforming agent may suppress gas generation in the mixture 134 so that it helps the solder particle 132 to reveal a wetting characteristic on a metal surface. The adhesive resin 130 is hardened after its solvent is evaporated through the heating process so that a resin layer 131 may be formed. Additionally, as shown in FIG. 10B, the solder particle 132, which flows along the dotted arrow in the adhesive resin 130, moves to and is attached to metal patterns (i.e., surfaces of the substrate connection terminal 9*a*, the via metal pattern 9*b*, the circuit metal pattern 9*c*, and a chip connection terminal 122) exposed to openings 15*a*, 15*b*, and 15*c*. Thus, an inner solder ball 133 is formed between the chip connection terminal 122 and the substrate connection terminal 9*a*. Simultaneously, solder particles 132, which do not become the inner solder ball 133 connecting the substrate connection terminal 9*a* with the chip connection terminal 122 and remain on a peripheral region, become a via dummy solder 132*b* and a circuit dummy solder 132*c* filling the via dummy opening 15*b* and the circuit dummy opening 15*c*, respectively. Since the circuit dummy opening 15*c* is formed with a width W1 that is broader than a width W2 of the circuit metal pattern 9*c* as shown in FIG. 9B, the solder particles 132 are attached to a top surface and both sidewalls of the exposed circuit metal pattern 9*c*. Accordingly, since the circuit dummy opening 15*c* is formed to have a width W1 broader than a width W2 of the circuit metal pattern 9*c*, an area of the circuit metal pattern 9*c* on which the solder particles 132 are attached broadens. Therefore, limitations such as electrical short and leakage current by remaining solder particles may be resolved so that a reliable semiconductor package may be provided. Moreover, since the dummy solders 132*b* and 132*c* are formed to fill the dummy openings 15*b* and 15*c* in the dummy openings 15*b* and 15*c*, they do not excessively protrude to the top surface of the first substrate insulation layer 13. Thus, compared to a case that a dummy solder is disposed on a substrate insulation layer without a dummy opening, according to the inventive concepts, top surfaces of the dummy solders 132*b* and 132*c* become far from the semiconductor chip 200. As a result, influences such as signal interference due to a coupling effect may be reduced. Therefore, a reliable semiconductor package may be realized.

Next, a molding layer 42 may be formed through a molding process.

Figure 11A:
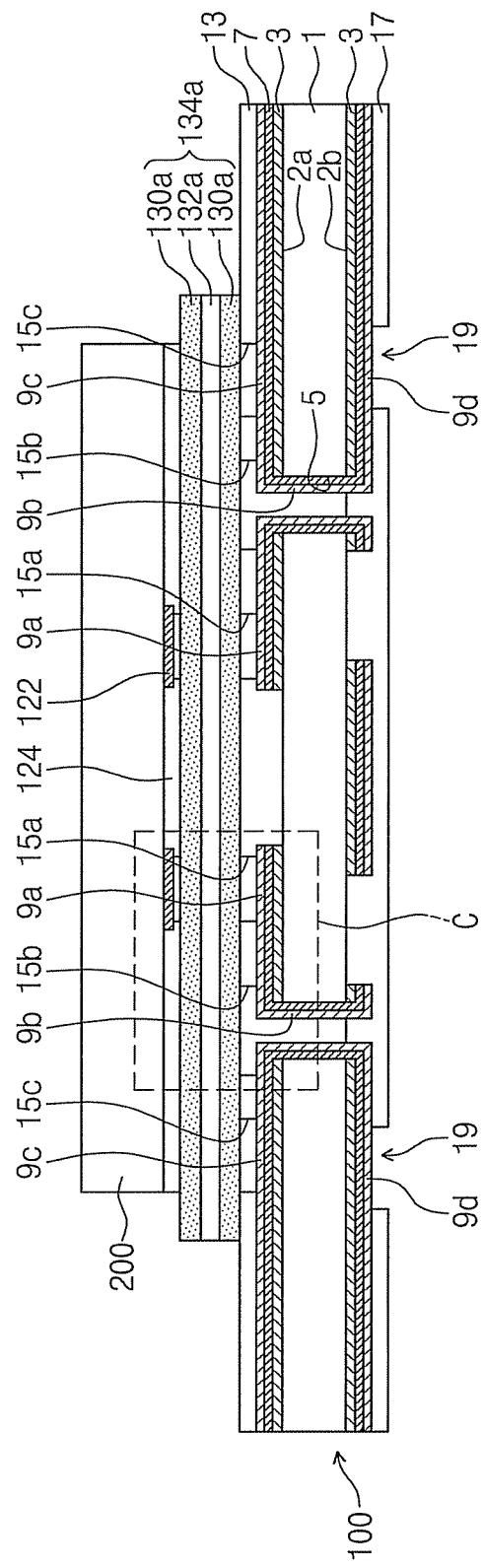
FIG. 11A is a manufacturing sectional view illustrating a semiconductor package having a section of FIG. 2 according to another example embodiment of the inventive concepts.
Figure 11B:
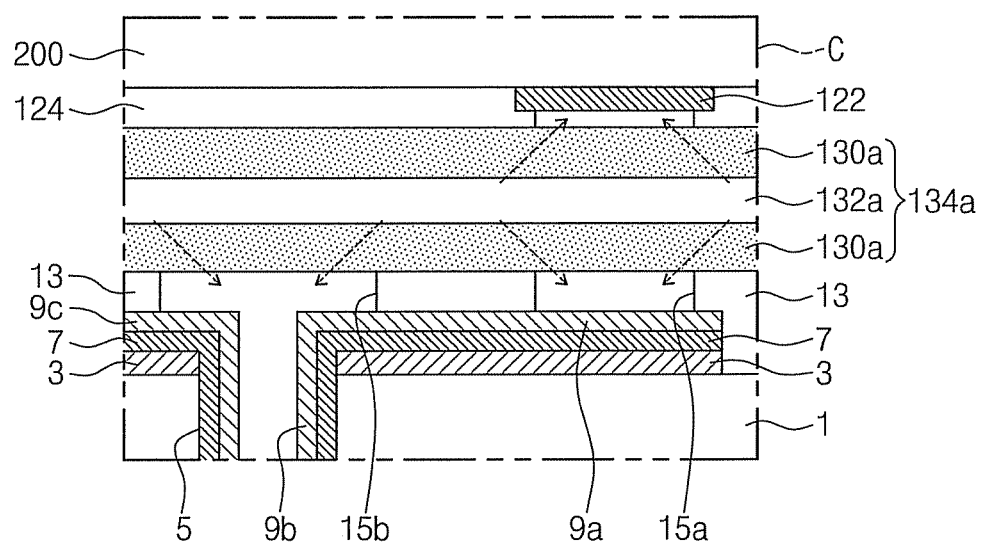
FIG. 11B is an enlarged sectional view of a portion C of FIG. 11A.

FIG. 11A is a manufacturing sectional view illustrating a semiconductor package having a section of FIG. 2 according to another example embodiment of the inventive concepts. FIG. 11B is an enlarged sectional view of a portion C of FIG. 11A.

Referring to FIGS. 11A, 11B, and 12, a mixed multilayer 134*a* (which may be called a solder foil) is provided on the circuit substrate 100 of FIG. 9A. The mixed multilayer 134*a* includes a solder particle layer 132*a* formed of a solder particle 132 (which will be described with reference to FIG. 10A) and an adhesive resin layer 130*a* formed of an adhesive resin 130 (which will be described with reference to FIG. 10A) disposed on both sides of the solder particle layer 132*a*. Also, the semiconductor chip 200 is provided on the mixed multilayer 134*a*. The circuit substrate 100 is heated. The adhesive resin layer 130*a* is hardened after its solvent is evaporated through the heating process so that a resin layer 131 may be formed. Additionally, as shown in FIG. 11B, the solder particle layer 132*a*, which flows along the dotted arrow in the adhesive resin layer 130*a*, moves to and is attached to metal patterns (i.e., surfaces of the substrate connection terminal 9*a*, the via metal pattern 9*b*, the circuit metal pattern 9*c*, and a chip connection terminal 122) exposed to openings 15*a*, 15*b*, and 15*c*. Thus, an inner solder ball 133 is formed between the chip connection terminal 122 and the substrate connection terminal 9*a*. Simultaneously, the solder particle layer 132*a*, which does not become the inner solder ball 133 connecting the substrate connection terminal 9*a* with the chip connection terminal 122 and remains on a peripheral region, become a via dummy solder 132*b* and a circuit dummy solder 132*c* filling the via dummy opening 15*b* and the circuit dummy opening 15*c*, respectively. Therefore, limitations such as electrical short and leakage current by a remaining solder particle layer may be resolved so that a reliable semiconductor package may be provided. Additionally, a self-assembly solder bonding process for more simple flip chip bonding may be performed using the mixed multilayer 134*a*.

According to an example embodiment of the inventive concepts, since a circuit dummy opening 15*c* is formed to expose a predetermined portion of a circuit metal pattern (i.e., a signal transmission path), a dummy metal pattern may not need to be formed purposely. Thus, a signal wiring design of a circuit substrate may not need to be changed. Accordingly, without a change of the signal wiring design of the circuit substrate, only a circuit dummy opening of a substrate insulation layer is formed on a desired position so that a reliable semiconductor package may be realized.

Embodiment 2

Figure 13:
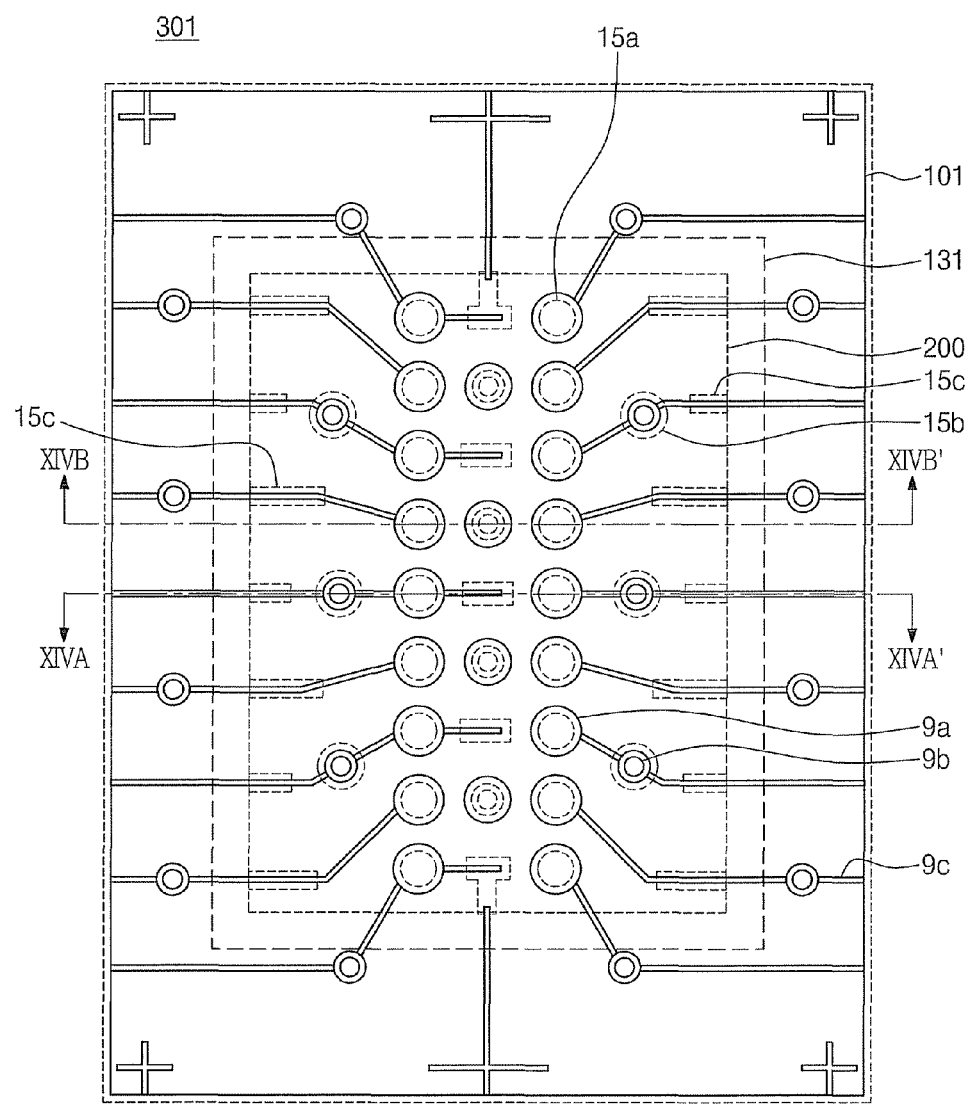
FIG. 13 is a plan view of a semiconductor package according to a second example embodiment of the inventive concepts.
Figure 14A:
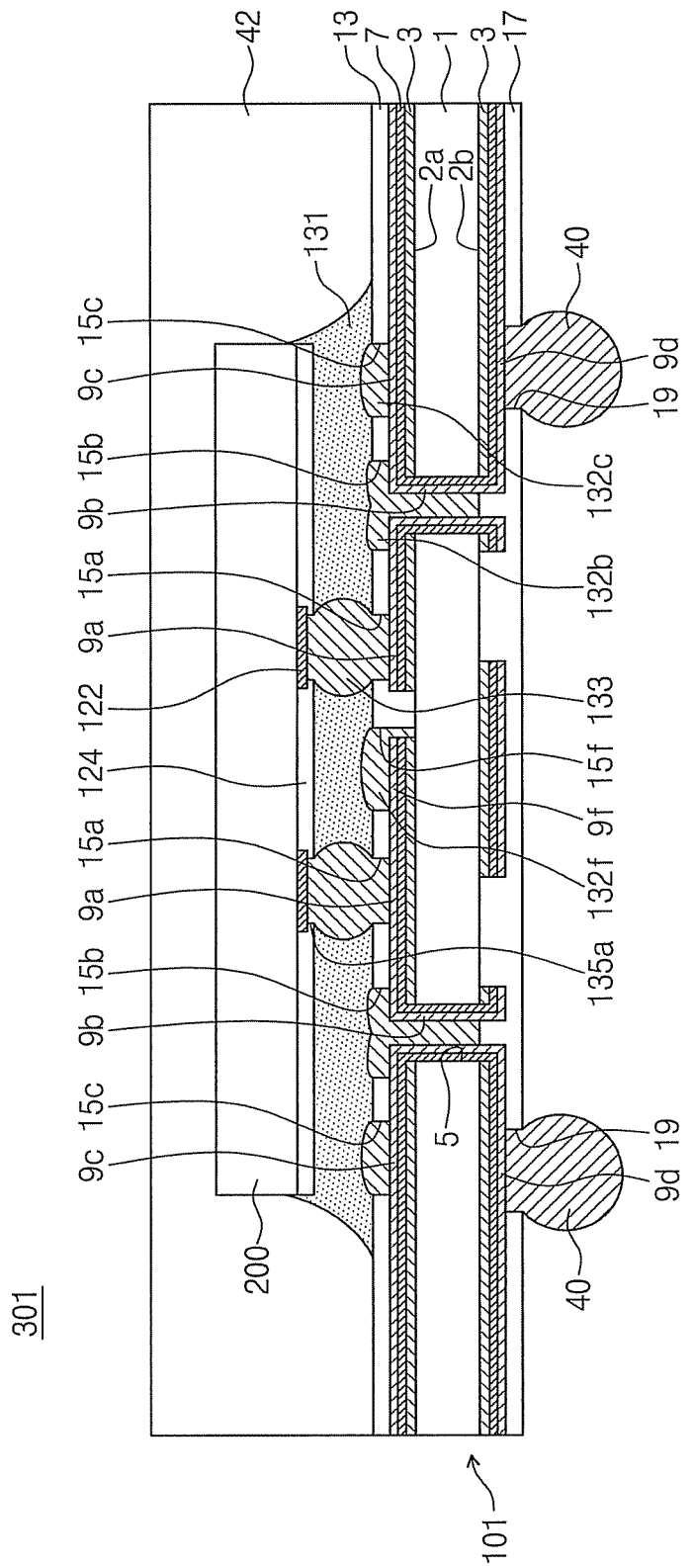
FIG. 14A is a sectional view taken along the line XIVA-XIVA' of FIG. 13.

FIG. 13 is a plan view of a semiconductor package according to a second example embodiment (embodiment 2) of the inventive concepts. FIG. 14A is a sectional view taken along the line XIVA-XIVA' of FIG. 13. FIG. 14B is a sectional view taken along the line XIVB-XIVB' of FIG. 13.

Referring to FIGS. 13, 14A and 14B, a substrate dummy metal pattern 9*f* and a recess metal pattern 9*e* are additionally disposed on a first side 2*a* of a circuit substrate 101 in a semiconductor package 301 according to the embodiment 2. The substrate dummy metal pattern 9*f* may be disposed between two adjacent substrate connection terminals 9*a*. A recessed region 5*a* is formed in a base substrate 1 of the circuit substrate 101 and the recess metal pattern 9*e* is disposed in the recessed region 5*a* thereby filling the recessed region 5*a*. The recess metal pattern 9*e* may be disposed between two adjacent substrate connection terminals 9*a* and between two adjacent substrate dummy metal patterns 9*f*. The positions of the substrate dummy metal pattern 9*f* and the recess metal pattern 9*e* are not limited thereto and may vary. A first substrate insulation layer 13 is disposed on the first side 2*a*. A substrate connection terminal opening 15*a* and dummy openings 15*b*, 15*c*, 15*e*, and 15*f* are formed in the first substrate insulation layer 13. The dummy openings 15*b*, 15*c*, 15*e*, and 15*f* may include a via dummy opening 15*b*, a circuit dummy opening 15*c*, a recess dummy opening 15*e*, and a substrate dummy opening 15*f*, which expose predetermined portions of a via metal pattern 9*b*, a circuit metal pattern 9*c*, a recess metal pattern 9*e*, and a substrate dummy metal pattern 9*f*, respectively. The dummy openings 15*b*, 15*c*, 15*e*, and 15*f* may be filled with a via dummy solder 132b, a circuit dummy solder 132c, a recess dummy solder 132e, and a substrate dummy solder 132f, respectively. Besides that, configurations may be identical/similar to those of the embodiment 1.

FIGS. 15A through 19A are manufacturing sectional views illustrating sequential manufacturing processes of a semiconductor package having a section of FIG. 14A. FIGS. 15B through 19B are manufacturing sectional views illustrating sequential manufacturing processes of a semiconductor package having a section of FIG. 14B.

Referring to FIGS. 15A and 15B, a base substrate 1 including a first side 2a and a second side 2b facing the first side 2a is prepared. A metal plate 3 may be stacked on the first side 2a and the second side 2b of the base substrate 1. The metal plate 3 may be a copper plate. A half-etching process may be performed to reduce a thickness of the metal plate 3. A via hole 5 penetrating the metal plate 3 and the base substrate 1 is formed through etching and drill processes. At this point, a recessed region 5a is formed by removing predetermined portions of the metal plate 3 and the base substrate 1. The via hole 5 and the recessed region 5a may be simultaneously or separately formed.

Figure 16A:
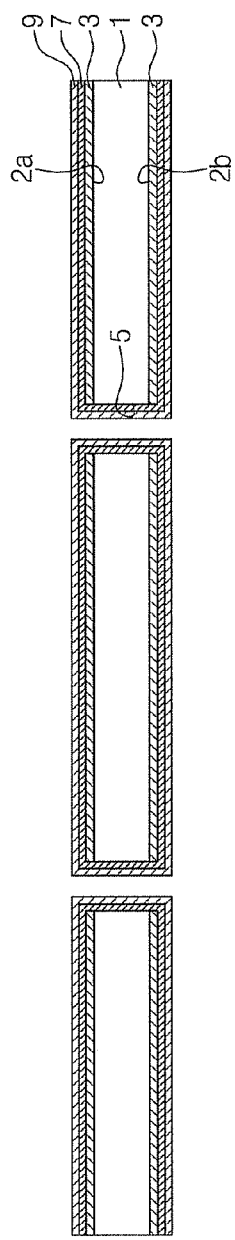
Figure 16B:
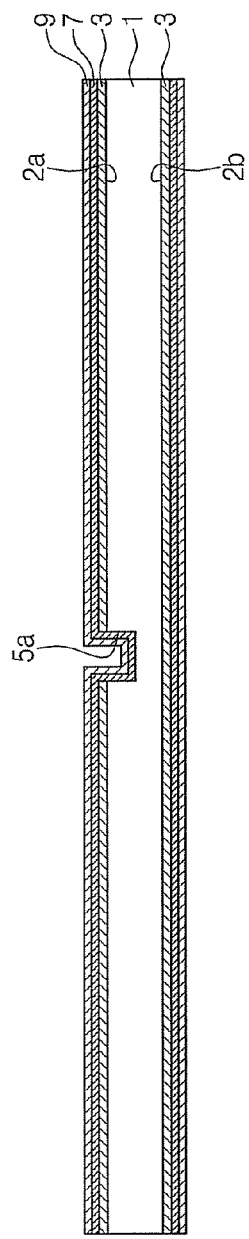

Referring to FIGS. 16A and 16B, a seed layer 7 is formed on the base substrate 1 having the via hole 5 and the recessed region 5a. The seed layer 7 may be formed through an electroless plating method. The seed layer 7 may include copper. The seed layer 7 is formed to cover the metal plate 3 on the first side 2a and the second sides 2b, an inner sidewall of the via hole 5, and the inner sidewall and the bottom of the recessed region 5a. An electro plating layer 9 is formed on the seed layer 7. The electro plating layer 9 may be formed through an electro plating method. The electro plating layer 9 may include copper. Since the electro plating layer 9 is formed on the seed layer 7, it is formed on the inner sidewall of the via hole 5 and the inner sidewall and the bottom of the recessed region 5a.

Referring to FIGS. 17A and 17B, by etching the electro plating layer 9 using a dry film mask as an etch mask, a substrate connection terminal 9a, a via metal pattern 9b, a circuit metal pattern 9c, a ball land 9d, a recess metal pattern 9e, and a substrate dummy metal pattern 9f are formed. The seed layer 7 and the metal plate 3 below the electrode plating layer 9 are etched simultaneously so that a surface of the base substrate 1 is exposed. Then, the dry film mask is removed.

Figure 18C:
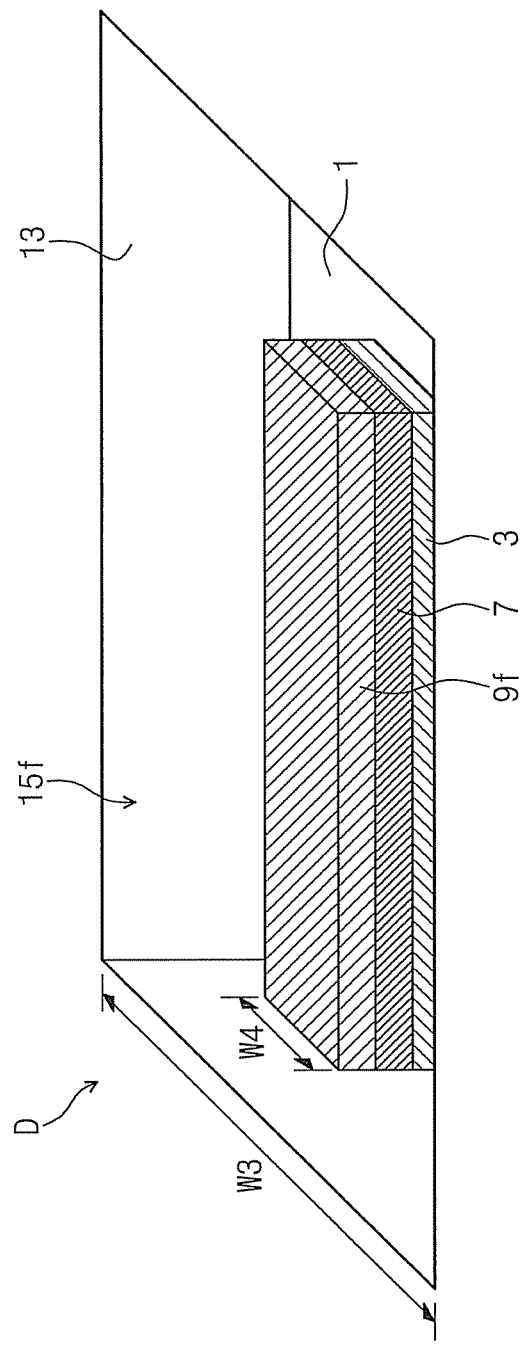
FIG. 18C is an enlarged perspective view of a portion D of FIG. 18A.

FIG. 18C is an enlarged perspective view of a portion D of FIG. 18A.

Referring to FIGS. 18A, 18B, and 18C, a first substrate insulation layer 13 is formed on the first side 2a of the base substrate 1, and a second substrate insulation layer 17 is formed on the second side 2b. The substrate insulation layers 13 and 17 as a solder resist layer may be formed of a photo sensitive photoresist and also may be formed through a photolithography process. The first substrate insulation layer 13 is formed to have a substrate connection terminal opening 15a exposing the substrate connection terminal 9a. The first substrate insulation layer 13 is formed to include dummy substrate openings 15b, 15c, 15e, and 15f. The dummy substrate openings 15b, 15c, 15e, and 15f may include a via dummy opening 15b, a circuit dummy opening 15c, a recess dummy opening 15e, and a substrate dummy opening 15f exposing predetermined portions of the via metal pattern 9b, the circuit metal pattern 9c, the recess metal pattern 9e, and the substrate dummy metal pattern 9f, respectively. The substrate dummy opening 15f may be formed to have a width W3 that is broader than a width W4 of the substrate dummy metal pattern 9f as shown in FIG. 18C. Accordingly, a surface of the base substrate 1 adjacent to both sidewalls of the substrate dummy metal pattern 9f may be exposed through the substrate dummy opening 15f. Additionally, three sides of the substrate dummy metal pattern 9f may be exposed. A ball land opening 19 exposing the ball land 9d may be formed in the second substrate insulation layer 17. Thus, a circuit substrate 101 may be completed.

Figure 19A:
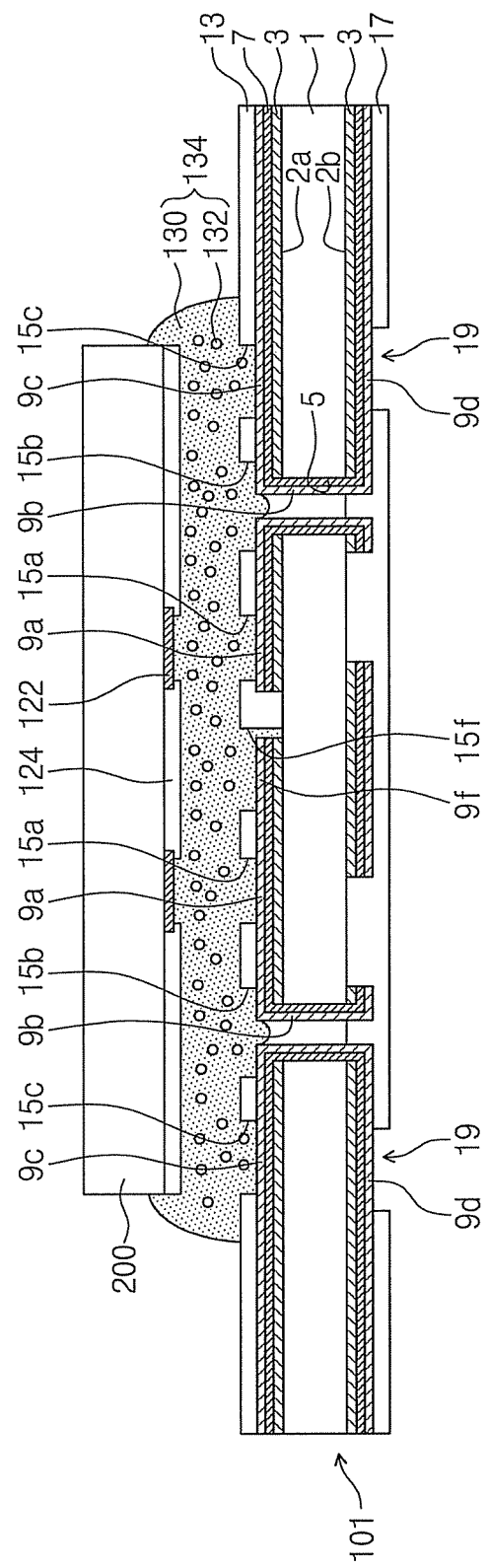
Figure 19B:
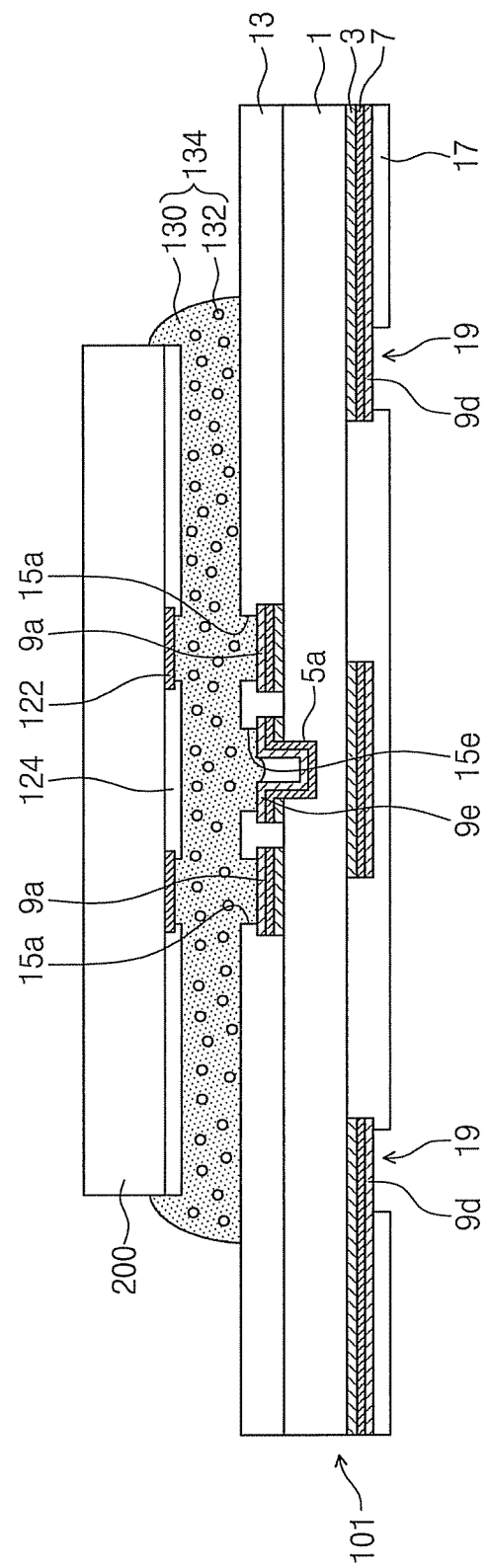

Referring to FIGS. 19A and 19B, a mixture 134 including a solder particle 132 and an adhesive resin 130 is applied on the circuit substrate 101. After the mixture 134 is applied, a semiconductor chip 200 is provided on the mixture 134. Then, the circuit substrate 100 is heated. At this point, the circuit substrate 100 is heated at a temperature of more than a melting point of the solder particle 132. Therefore, referring to FIGS. 14A and 14B, the adhesive resin 130 is hardened after its solvent is evaporated through the heating process so that a resin layer 131 may be formed. Additionally, the solder particle 132, which flows in the adhesive resin 130, moves to and is attached to metal patterns (i.e., surfaces of the substrate connection terminal 9a, the via metal pattern 9b, the circuit metal pattern 9c, the recess metal pattern 9e, the substrate dummy metal pattern 9f, the chip connection terminal 122) exposed to openings 15a, 15b, 15c, 15e, and 15f. Thus, an inner solder ball 133 is formed between the chip connection terminal 122 and the substrate connection terminal 9a. Simultaneously, solder particles 132, which do not become the inner solder ball 133 connecting the substrate connection terminal 9a with the chip connection terminal 122 and remain on a peripheral region, become a via dummy solder 132b, a circuit dummy solder 132c, a recess dummy solder 132e, and a substrate dummy solder 132f filling the dummy opening 15b, 15c, 15e, and 15f, respectively.

As described with reference to FIG. 11A, a self-assembly solder bonding process may be performed using the mixed multilayer. Its forming process may be identical/similar to that of the embodiment 1.

In this example embodiment, there is a change of a signal wiring design of a circuit substrate according to an addition of a substrate dummy metal pattern and a recess metal pattern. However, according to this example embodiment, since dummy openings are formed in the first substrate insulation layer to allow the dummy solders to fill the dummy openings, a reliable semiconductor package described in the embodiment 1 may be realized.

Embodiment 3

Figure 20:
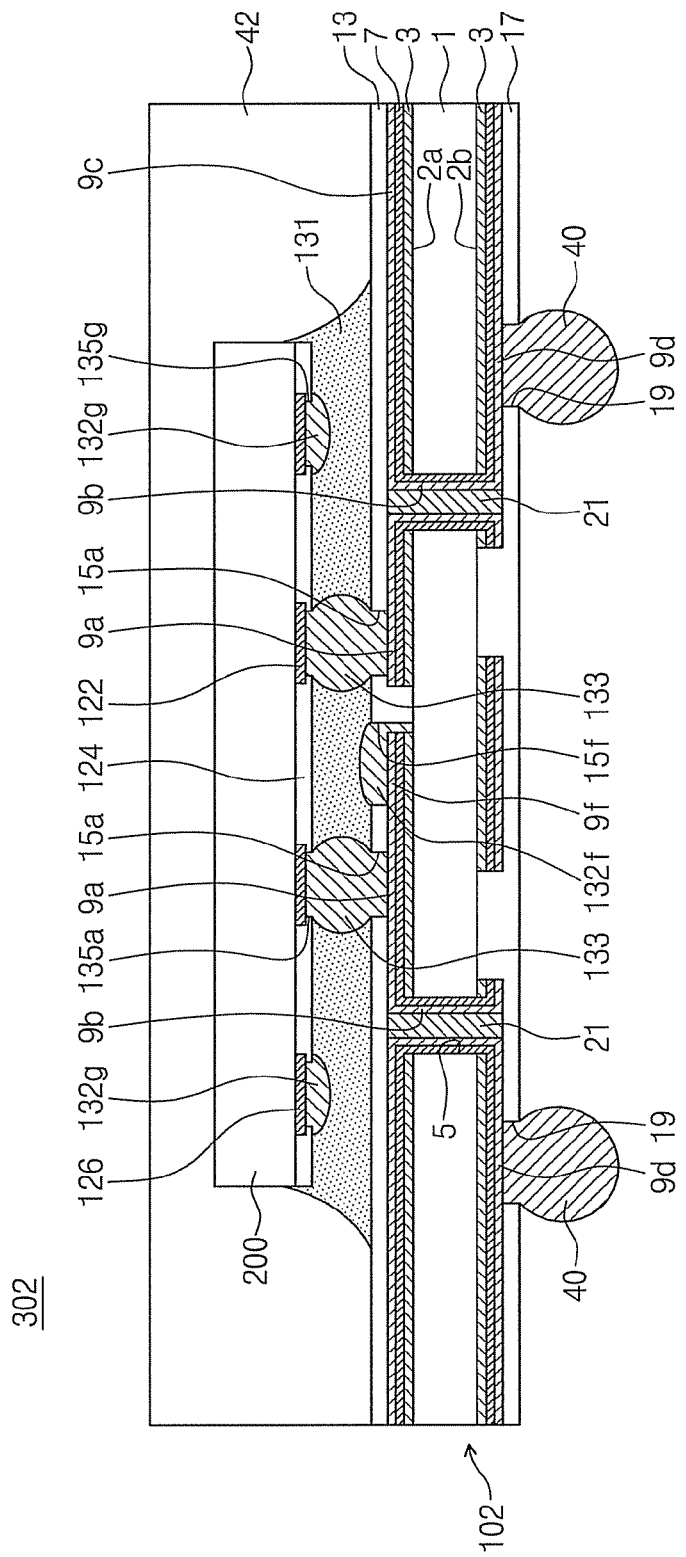
FIG. 20 is a sectional view of a semiconductor package according to a third example embodiment.

FIG. 20 is a sectional view of a semiconductor package according to a third example embodiment (embodiment 3).

Referring to FIG. 20, in relation to the semiconductor package 302 according to the embodiment 3, a chip connection terminal 122 and a chip dummy metal pattern 126 are disposed at the bottom surface of a semiconductor chip 200 mounted on a circuit substrate 102. Then, a chip insulation layer 124, which includes a chip connection terminal opening 135a exposing the chip connection terminal 122 and a chip dummy opening 135g exposing the chip dummy metal pattern 126 is provided at the bottom surface of the semiconductor chip 200. The chip dummy opening 135g is filled with a chip dummy solder 132g. This may be the feature of this example embodiment.

Selectively, a first substrate insulation layer 13 having a substrate dummy metal pattern 132f and a substrate dummy opening 15f exposing the same may be disposed on the circuit substrate 102. The positions of the chip dummy opening 135g and the substrate dummy opening 15f may not overlap each other. The first substrate insulation layer 13 does not expose a circuit metal pattern 9c and a via metal pattern 9b. Unlike the embodiment 2 (in which the via hole 5 is filled with the via dummy solder 132b), according to this example embodiment, the via hole 5 may be filled with a conductive paste 21.

The circuit substrate 102 of this example embodiment may be replaced with the circuit substrate 100 of the embodiment 1. Besides that, a configuration and a manufacturing method may be identical/similar to those of the embodiment 1.

Embodiment 4

Figure 21:
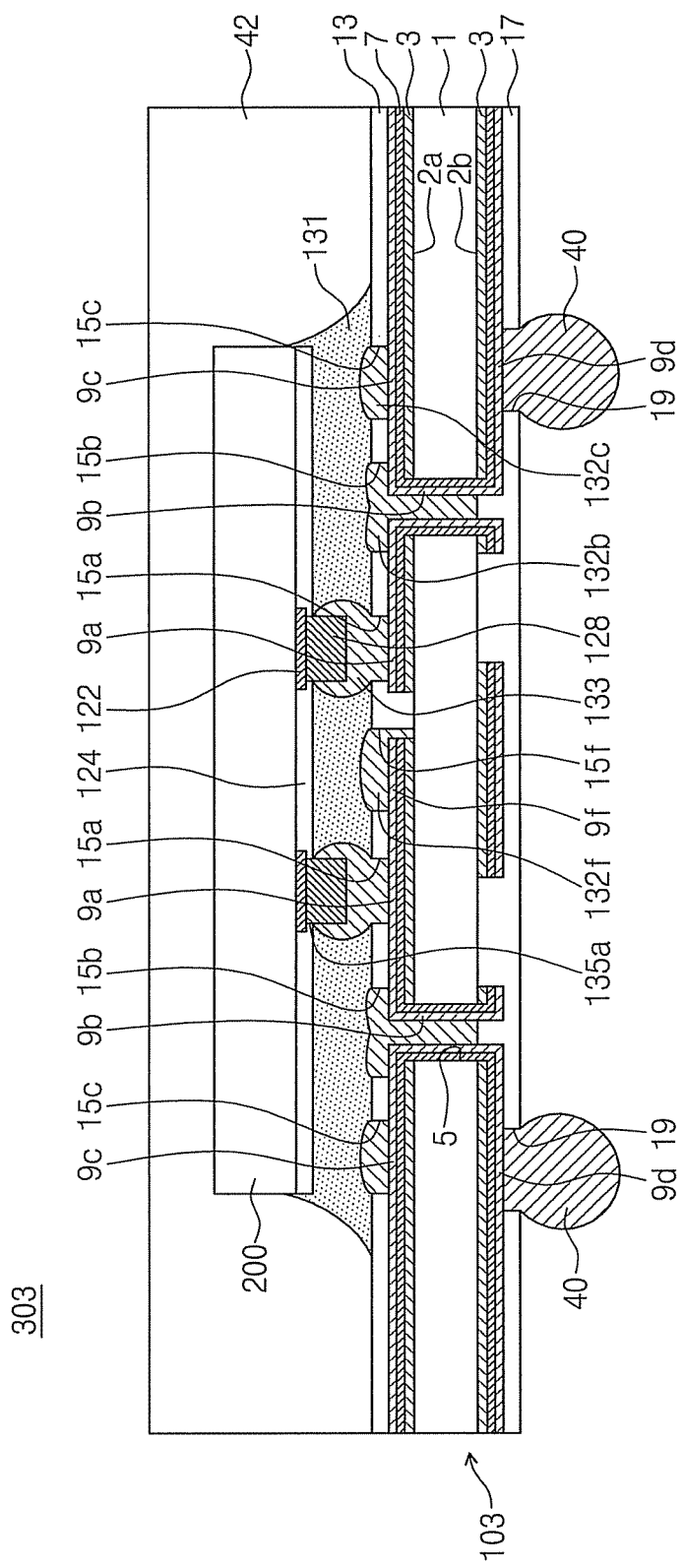
FIG. 21 is a sectional view of a semiconductor package according to a fourth example embodiment of the inventive concepts.

FIG. 21 is a sectional view of a semiconductor package according to a fourth example embodiment (embodiment 4) of the inventive concepts.

Referring to FIG. 21, in relation to the semiconductor package 303 according to this example embodiment, a bump 128 is attached to a chip connection terminal 122 disposed at the bottom surface of a semiconductor chip 200 mounted on a circuit substrate 103. An inner solder ball 133 connecting the chip connection terminal 122 with a substrate connection terminal 9a electrically is formed to cover at least a side of the bump 128. The inner solder ball 133 may cover the bottom of the bump 128.

During a self-assembly solder bonding process in forming processes of the semiconductor package 303, the side and the bottom of the bump 128 are exposed so that an area to which solder particles are attached is increased. As a result, the adhesiveness between an inner solder ball 133 and the bump 128 may be improved. Additionally, due to the height of the bump 128, an interval between the semiconductor chip 200 and the circuit substrate 103 may be uniformly maintained. Thus, a reliable semiconductor package may be realized. In this example embodiment, the circuit substrate 103 may be identical to that 101 of the embodiment 2. Besides that, a configuration and a manufacturing method may be identical/similar to those of the embodiments 1 to 3.

Embodiment 5

Figure 22:
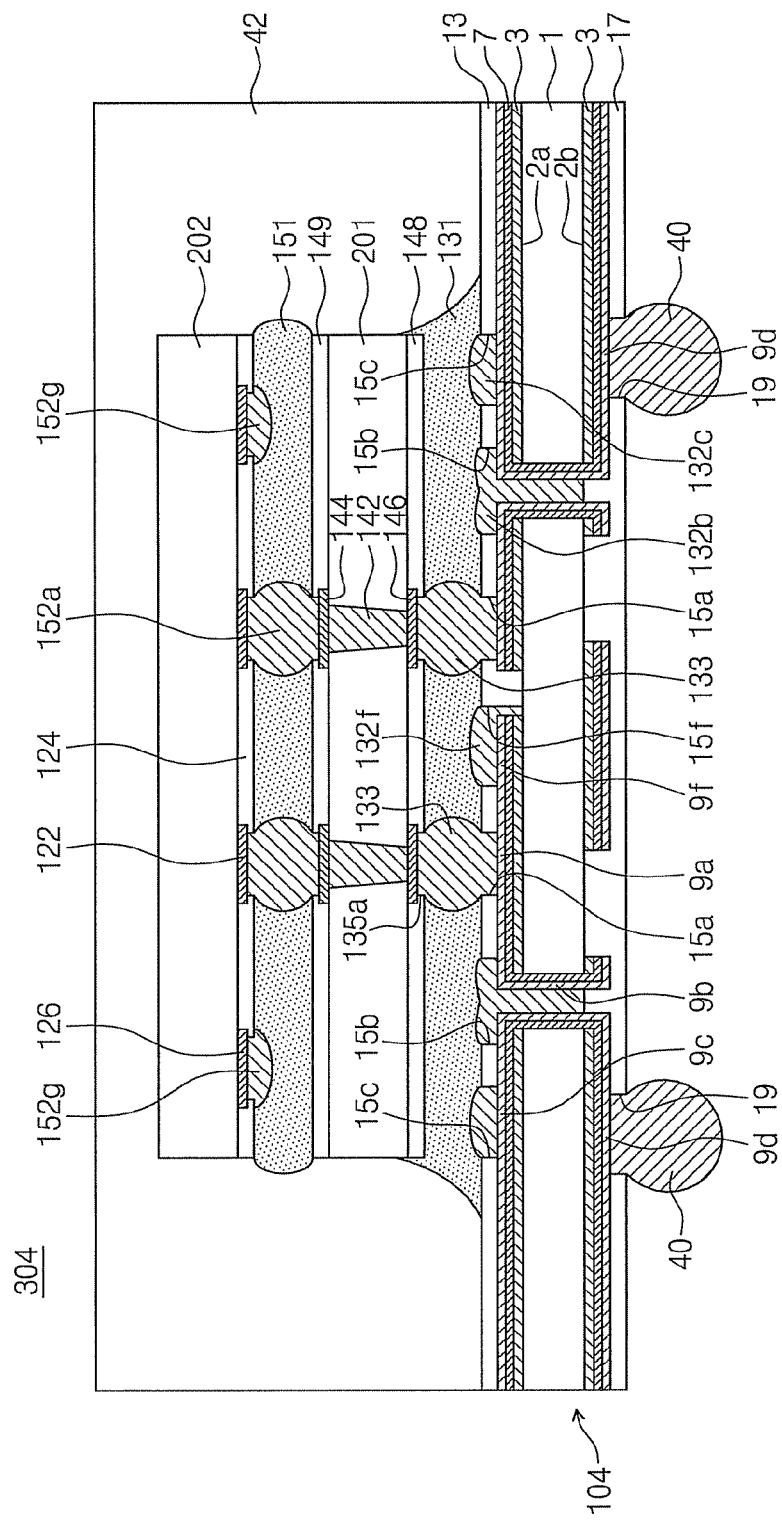
FIG. 22 is a sectional view of a semiconductor package according to a fifth example embodiment.

FIG. 22 is a sectional view of a semiconductor package according to a fifth example embodiment (embodiment 5).

Referring to FIG. 22, in relation to the semiconductor package 304 of the embodiment 4, more than two semiconductor chips 200 and 201 are stacked and mounted on a circuit substrate 104. That is, the lower semiconductor chip 201 is stacked on the circuit substrate 104 and the upper semiconductor chip 202 is stacked on the lower semiconductor chip 201. A through via 142 penetrating the inside may be formed in the lower semiconductor chip 201. A first lower chip connection terminal 146 contacting the bottom of the through via 142 and a first lower chip insulation layer 148 exposing the first lower chip connection terminal 146 are disposed at the bottom surface of the lower semiconductor chip 201. A second lower chip connection terminal 144 contacting the top of the through via 142 and a second lower chip insulation layer 149 exposing the second lower chip connection terminal 144 are disposed on the top surface of the lower semiconductor chip 201. An upper chip connection terminal 122 and an upper chip dummy metal pattern 126 are disposed at the bottom of the upper semiconductor chip 202. Also, an upper chip insulation layer 124 exposing the upper chip connection terminal 122 and the upper chip dummy metal pattern 126 is disposed at the bottom of the upper semiconductor chip 202. An upper chip dummy solder 152g is attached to the upper chip dummy metal pattern 126. A first inner solder ball 133 is disposed between the first lower chip connection terminal 146 and a substrate connection terminal 9a of the circuit substrate 104. A second inner solder ball 152a is disposed between the upper chip connection terminal 122 and the second lower chip connection terminal 144.

The circuit substrate 104 of this example embodiment may be identical/similar to circuit substrate 101 as shown in FIG. 14. Additionally, the chip dummy metal pattern 126 is disposed on the bottom surface of the semiconductor chip 202 but may be disposed at the top surface or the bottom surface of the lower semiconductor chip 201. When the chip dummy metal pattern 126 is disposed at the bottom surface of the lower semiconductor chip 201, it may be disposed at a position that do not overlap dummy openings 15a, 15b, 15c, and 15f of the circuit substrate 104.

FIGS. 23 through 26 are manufacturing sectional views illustrating sequential manufacturing processes of a semiconductor package having a section of FIG. 22 according to an example embodiment of the inventive concepts.

Figure 23:
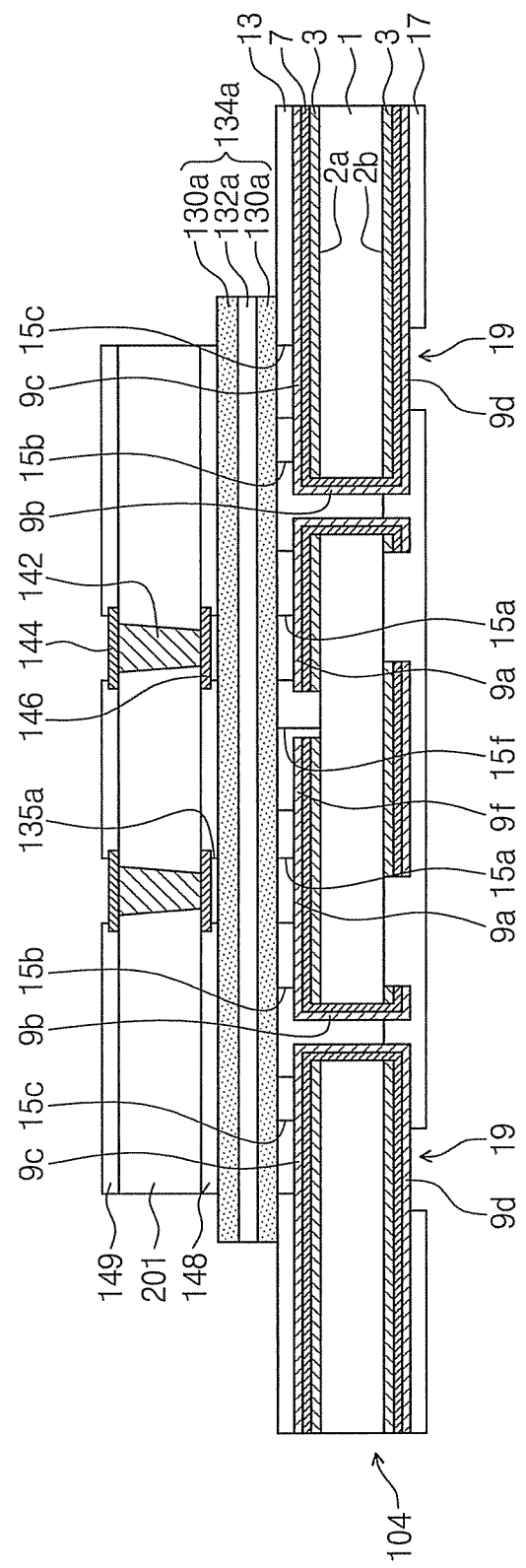
FIGS. 23 through 26 are manufacturing sectional views illustrating sequential manufacturing processes of a semiconductor package having a section of FIG. 22 according to an example embodiment of the inventive concepts.

Referring to FIG. 23, a first mixed multilayer 134a is provided on a circuit substrate 104. The first mixed multilayer 134a includes a first solder particle layer 132a formed of the solder particle 132 of FIG. 10A and a first adhesive resin layer 130a disposed at the both sides of the first solder particle layer 132a and formed of the adhesive resin 130 of FIG. 10A. Also, a lower semiconductor chip 201 is provided on the first mixture multilayer 134a.

Figure 24:
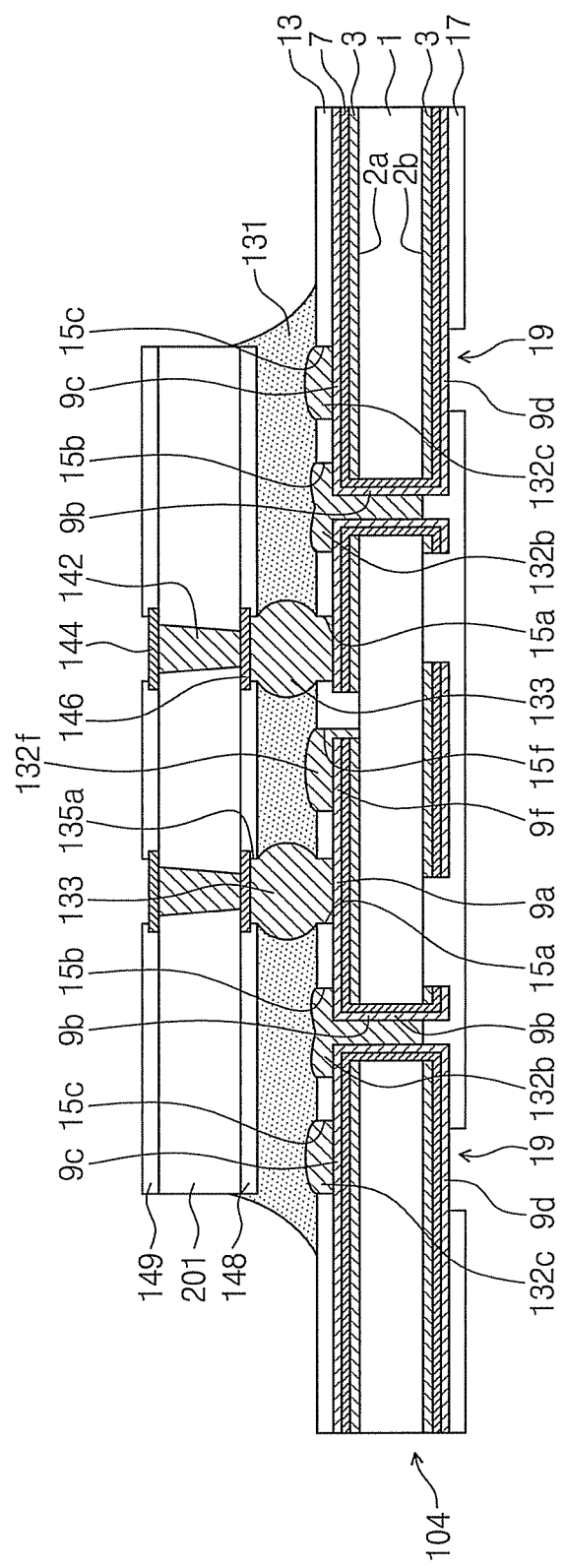

Referring to FIG. 24, the circuit substrate 100 is heated. The first adhesive resin layer 130a is hardened after its solvent is evaporated through the heating process so that a first resin layer 131 may be formed. The first solder particle layer 132a moves to and is attached to metal patterns (i.e., surfaces of the substrate connection terminal 9a, the via metal pattern 9b, the circuit metal pattern 9c, the substrate dummy metal pattern 9f, and the first lower chip connection terminal 146) exposed to openings 15a, 15b, 15c, and 15f in the adhesive resin layer 130a. Therefore, a first inner solder ball 133 is formed between the first lower chip connection terminal 146 and the substrate connection terminal 9a. Simultaneously, the solder particle layer 132a, which does not become the first inner solder ball 133 connecting the substrate connection terminal 9a with the first lower chip connection terminal 146 and remains on a peripheral region, becomes a via dummy solder 132b, a circuit dummy solder 132c, and a substrate dummy solder 132f filling the dummy opening 15b, 15c, and 15f, respectively.

Figure 25:
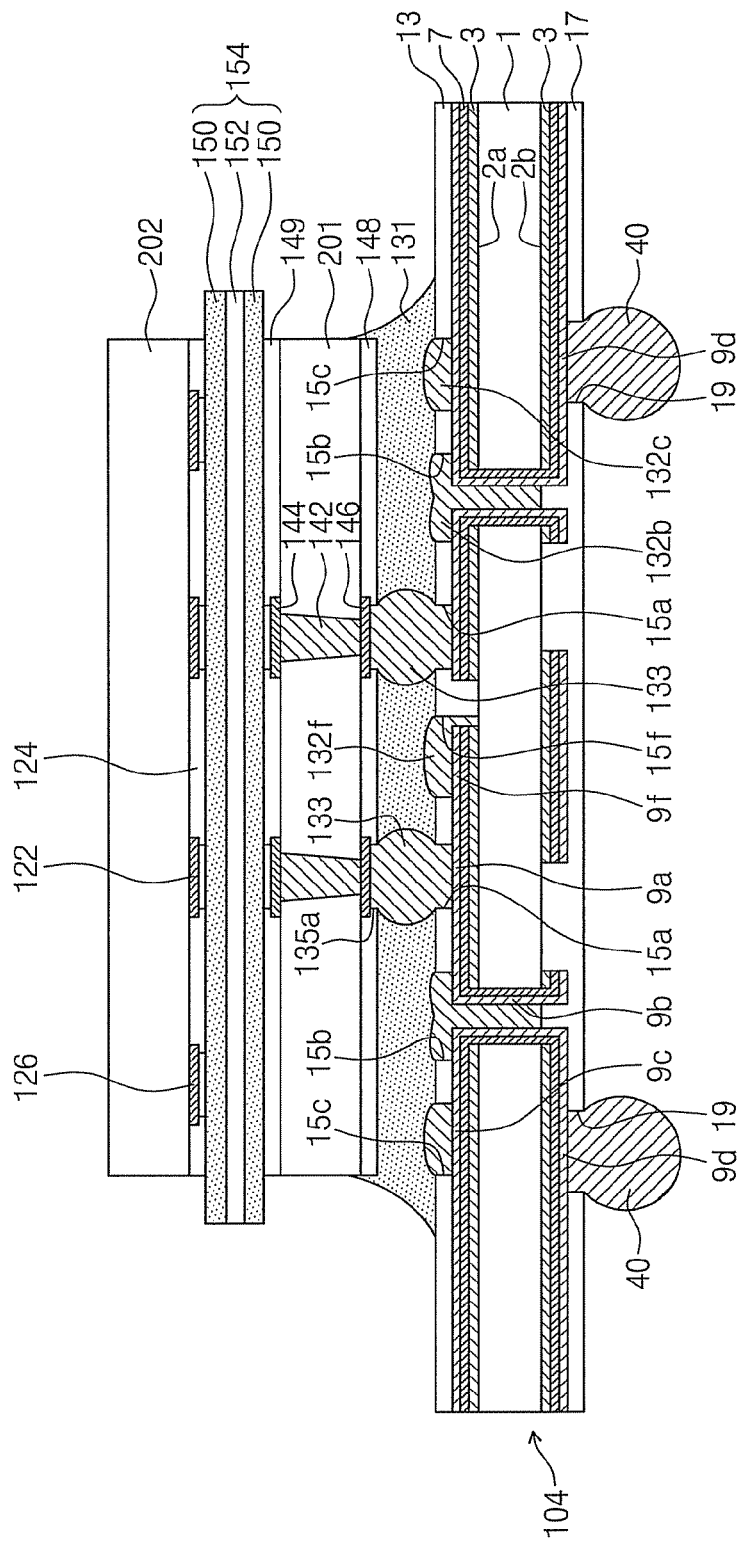

Referring to FIG. 25, a second mixed multilayer 154 is provided on the lower semiconductor chip 201. The second mixed multilayer 154 includes a second solder particle layer 152 formed of the solder particle 132 of FIG. 10A and a second adhesive resin layer 150 disposed at the both sides of the second solder particle layer 152 and formed of the adhesive resin 130 of FIG. 10A. Also, an upper semiconductor chip 202 is provided on the second mixture multilayer 154.

Figure 26:
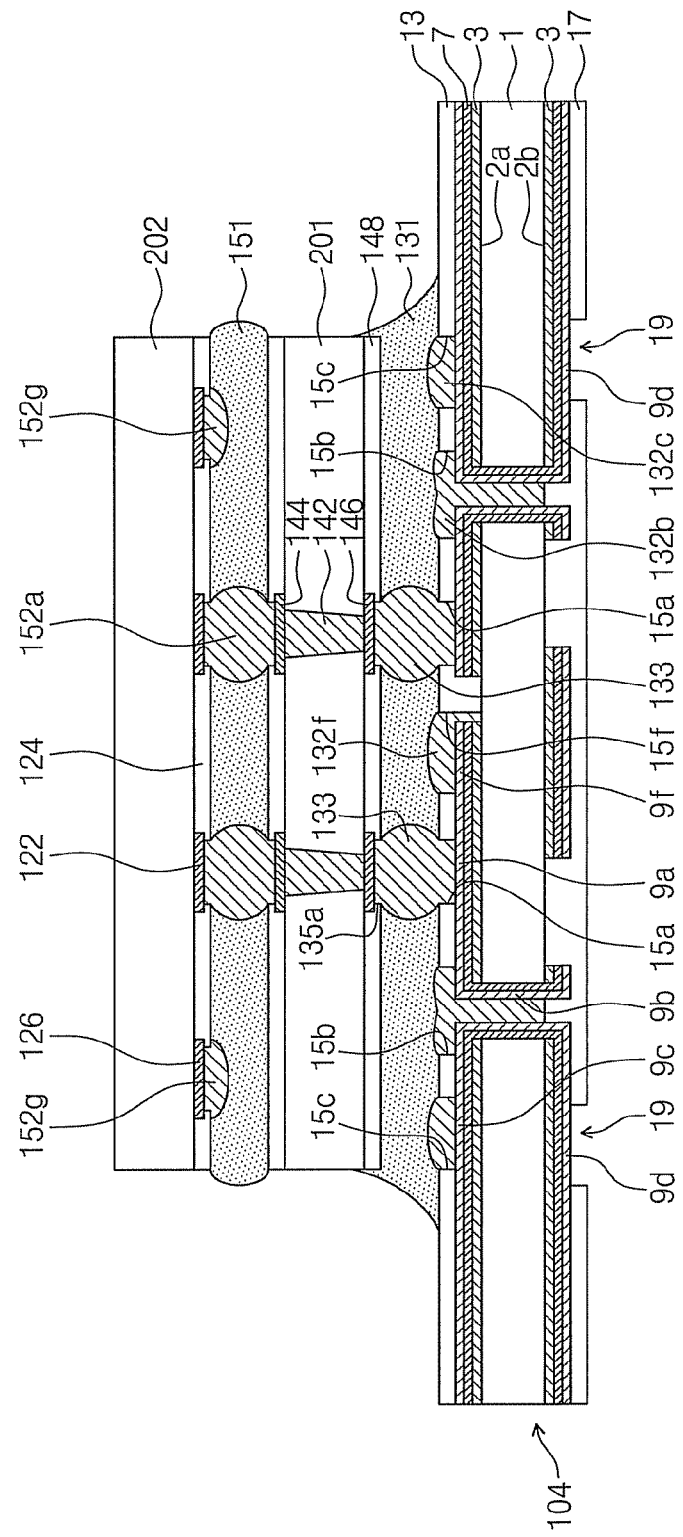

Referring to FIG. 26, the circuit substrate 100 is heated. The second adhesive resin layer 150 is hardened after its solvent is evaporated through the heating process so that a second resin layer 151 may be formed. The second solder particle layer 152 moves to and is attached to metal patterns (i.e., surfaces of the second lower chip connection terminal 144, the upper chip connection terminal 122, and the upper chip dummy metal pattern 126). Therefore, a second inner solder ball 152a is formed between the second lower chip connection terminal 144 and the upper chip connection terminal 122 and an upper chip dummy solder 152g is formed in the upper chip dummy metal pattern 126.

Next, after an external solder ball 40 is attached and a molding layer 42 is formed, a semiconductor package 304 having a section of FIG. 22 may be completed.

Figure 27:
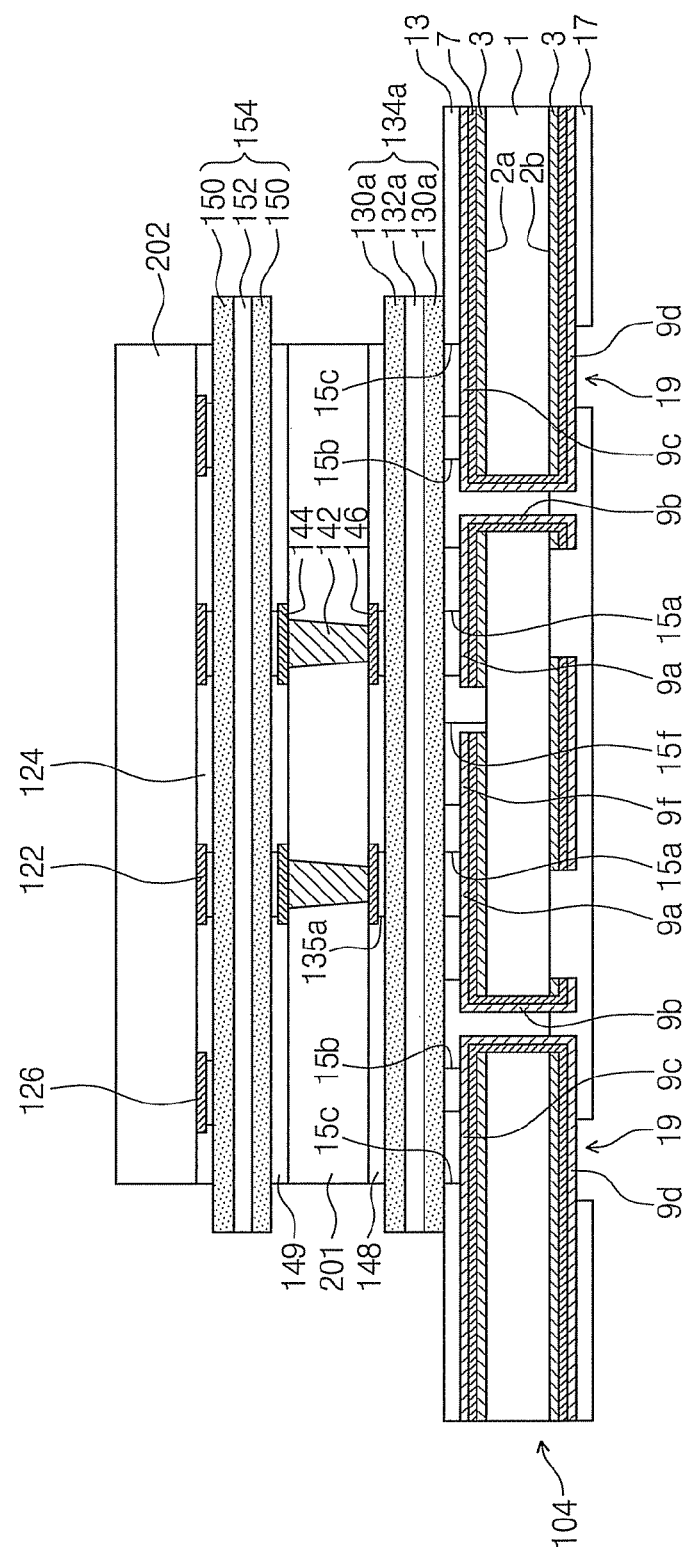
FIG. 27 is a manufacturing sectional view illustrating sequential manufacturing processes of a semiconductor package having a section of FIG. 22 according to another example embodiment of the inventive concepts.

FIG. 27 is a manufacturing sectional view illustrating sequential manufacturing processes of a semiconductor package having a section of FIG. 22 according to another example embodiment of the inventive concepts.

Referring to FIG. 27, a first mixed multilayer 134a, a lower semiconductor chip 201, a second mixed multilayer layer 154, and an upper semiconductor chip 202 are sequentially stacked on a circuit substrate 104. Then, the circuit board 104 is heated so that a structure having a section of FIG. 26 may be manufactured more simply.

Although a mixed multilayer is used in the manufacturing method of this example embodiment, as described with reference to FIGS. 10A, 10B, and 12, a mixture 134 is applied for the next process. When the lower semiconductor chip 201 is joined to the upper semiconductor chip 202 simultaneously using the mixture 134, the lower semiconductor chip 201 and the upper semiconductor chip 202 may be stacked when a solvent is volatized by hardening the mixture 134.

Although a semiconductor chip is mounted on a circuit substrate and an external solder ball 40 is attached to the circuit substrate in the semiconductor packages in the embodiments 1 through 5, the circuit substrate itself may correspond to a mother board and thus the external solder ball 40 may not be attached.

The semiconductor package technique may be applied to various kinds of semiconductor devices and a package module including the same.

Figure 28:
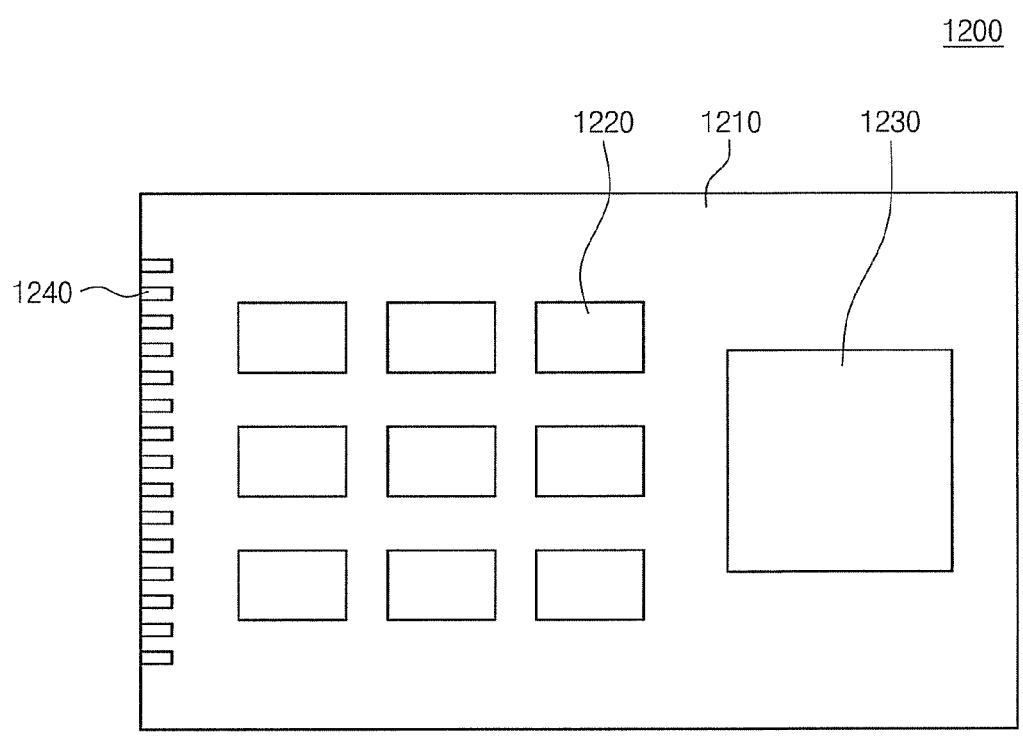
FIG. 28 is a view illustrating an example of a package module including a semiconductor package that the technique of the inventive concepts is applied.

FIG. 28 is a view illustrating an example of a package module including a semiconductor package that the technique of the inventive concepts is applied. Referring to FIG. 28, the package module 1200 may include a semiconductor integrated circuit chip 1220 and a Quad Flat Package (QFP) applied semiconductor integrated circuit chip 1230. As the semiconductor devices 1220 and 1230 to which a semiconductor package technique of the inventive concepts is applied are mounted on a substrate 1210, the package module 1200 may be formed. The package module 1200 may be connected to an external electronic device through an external connection terminal 1240 at one side of the substrate 1210.

Figure 29:
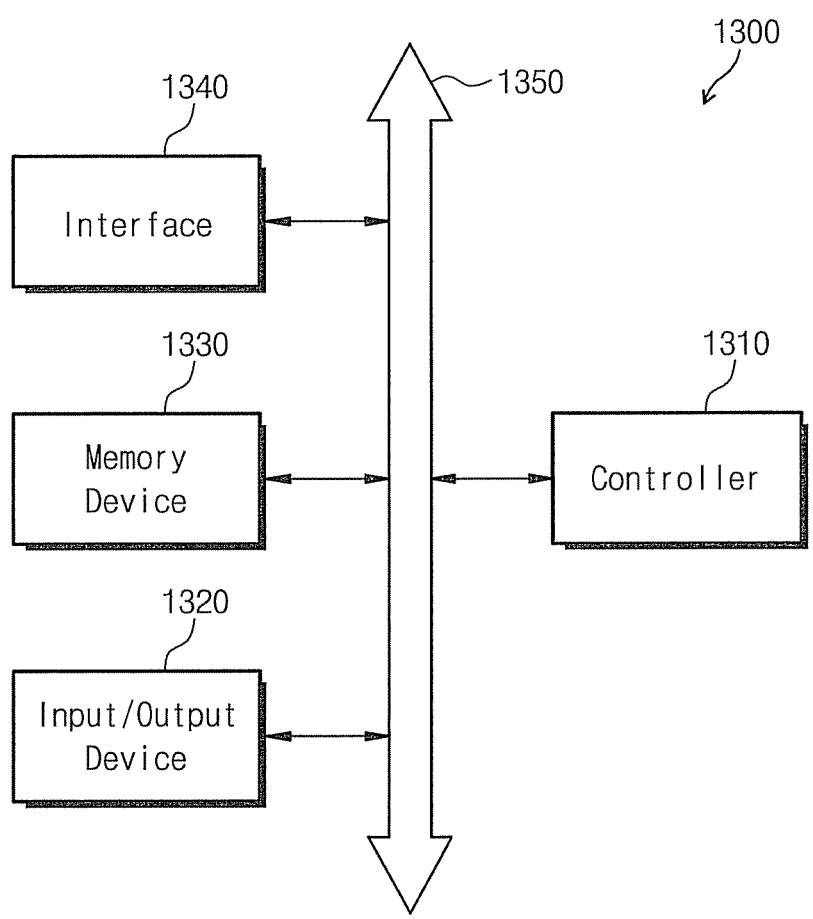
FIG. 29 is a block diagram illustrating an example of an electronic device including a semiconductor package that the technique of the inventive concepts is applied.

The above semiconductor package technique may be applied to an electronic system. FIG. 29 is a block diagram illustrating an example of an electronic device including a semiconductor package that the technique of the inventive concepts is applied. Referring to FIG. 29, the electronic system 1300 may include a controller 1310, an input/output device (or I/O) 1320 such as a keypad, a keyboard, and a display, and a memory device 1330. The controller 1310, the input/output device 1320, and the memory device 1330 may be combined through a bus 1350. The bus 1350 is a path through which data transfers. For example, the controller 1310 may include at least one micro processor, digital signal processor, micro controller, or other processors similar thereto. The controller 1310 and the memory device 1330 may include a semiconductor package according to the inventive concepts. The input/output device 1320 may include a keyboard, a keypad, or a display device. The memory device 1330 stores data. The memory device 1330 may store data and/or commands executed by the controller 1310. The memory device 1330 may include a volatile memory device and/or a nonvolatile memory device. Or, the memory device 1310 may be formed of a flash memory. For example, a flash memory to which the technique of the inventive concepts is applied may be mounted on an information processing system such as a mobile device or a desktop computer. This flash memory may include a semiconductor disk device (SSD). In this case, the electronic system 1300 may stably store a large amount of data in the flash memory system. The electronic system 1300 may further include an interface 1340 for transmitting or receiving data to or from a network. The interface 1349 may have a wire/wireless form. For example, the interface 1340 may include an antenna or a wire/wireless transceiver. Although not shown in the drawings, it is apparent to those skilled in the art that the electronic system 1300 may further include an application chipset, a camera image processor (CIS), and an input/output device.

The electronic system 1300 may be realized with a mobile system, a personal computer, an industrial computer, or a system performing various functions. For example the mobile system may be a personal digital assistant (PDA), a portable computer, a web tablet, a mobile phone, a wireless phone, a laptop computer, a memory card, a digital music system, or an information transmitting/receiving system. If the electronic system 1300 is a device for wireless communication, it may use a communication interface protocol of the third generation communication system such as code division multiple access (CDMA), global system for mobile communications (GSM), enhanced-time division multiple access (E-TDMA), wideband code division multiple access (W-CDMA), and CDMA1000.

Figure 30:
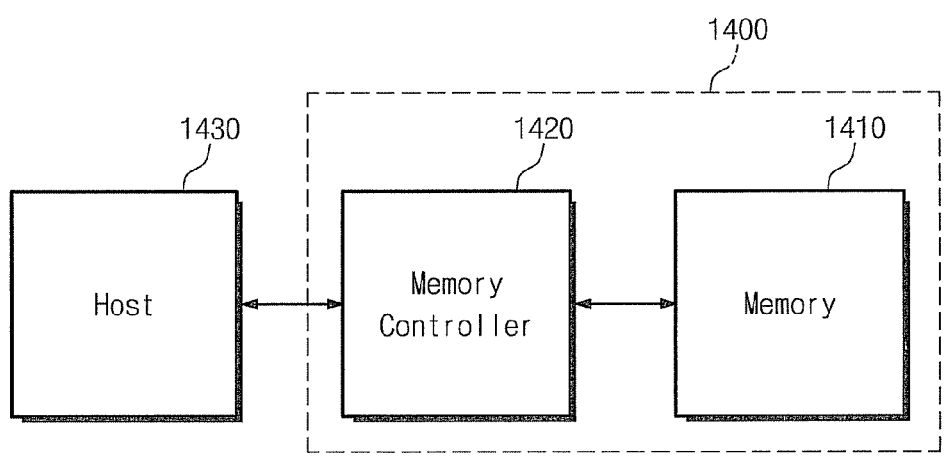
FIG. 30 is a block diagram illustrating a memory system with a semiconductor package that the technique of the inventive concepts is applied.

A semiconductor device to which the technique of the inventive concepts is applied may be provided with a form of a memory card. FIG. 30 is a block diagram illustrating a memory system with a semiconductor package that the technique of the inventive concepts is applied. Referring to FIG. 30, the memory card 1400 includes a non-volatile memory device 1410 and a memory controller 1420. The non-volatile memory device 1410 and the memory controller 1420 may store data or read the stored data. The non-volatile memory device 1410 may include at least one of the non-volatile memory devices that the technique of the inventive concepts is applied. The memory controller 1420 may control the flash memory device 1410 to read stored data or store data in response to a read/write request from a host. The memory card 1400 may interface with a host 1430 that may use the memory card 1400 to store or retrieve data.

According to an example embodiment of the inventive concepts, at least one of a substrate insulation layer and a chip insulation layer includes a dummy opening. During a self-assembly solder bonding process for flip chip bonding, dummy solder is formed by filling the dummy opening with solder particles, which do not become an inner solder ball and thus remain on a peripheral region. Thus, compared to a case that a dummy solder is disposed on a substrate insulation layer without a dummy opening, according to the inventive concepts, a top surface of a dummy solder does not protrude excessively, so that it becomes far from the semiconductor chip. As a result, influences such as signal interference due to a coupling effect may be reduced. Therefore, limitations such as electrical short and leakage current by remaining solder particles may be resolved so that a reliable semiconductor package may be provided.

According to an example embodiment of the inventive concepts, since a circuit dummy opening is formed to expose a predetermined portion of a circuit metal pattern (i.e., a signal transmission path), a dummy metal pattern may not need to be formed purposely. Thus, a signal wiring design of a circuit substrate may not need to be changed. Accordingly, without a change of the signal wiring design of the circuit substrate, only a circuit dummy opening of a substrate insulation layer is formed on a desired position so that a reliable semiconductor package may be realized.

The above-disclosed subject matter is to be considered illustrative and not restrictive, and the appended claims are intended to cover all such modifications, enhancements, and other example embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A method of manufacturing a semiconductor package, the method comprising:
    forming a circuit substrate including a base substrate, a substrate connection terminal on the base substrate, and a substrate insulation layer covering the base substrate and exposing the substrate connection terminal;
    forming a mixture layer on the circuit substrate, the mixture layer including an adhesive resin and a plurality of solder particles;
    providing a first semiconductor chip on the mixture layer, the first semiconductor chip including a chip connection terminal and a chip insulation layer exposing the chip connection terminal;
    forming an inner solder ball between the substrate connection terminal and the chip connection terminal; and
    forming a dummy solder in a dummy opening, the dummy opening being in one of the substrate insulation layer and the chip insulation layer, the dummy solder configured to be physically spaced apart from one of the circuit substrate and the first semiconductor chip.

2. The method of claim 1, wherein the solder particles are dispersed in the adhesive resin.

3. The method of claim 1, wherein the forming a mixture layer comprises providing a mixed multilayer including an adhesive resin layer formed of the adhesive resin and a solder particle layer formed of the solder particles.

4. The method of claim 1, wherein at least one of the forming a dummy solder and the forming an inner solder ball comprises heating the mixture layer to a temperature of more than a melting point of the solder particles.

5. The method of claim 1, wherein the forming a circuit substrate comprises:
    preparing the base substrate;
    forming the substrate connection terminal on the base substrate; and
    forming the substrate insulation layer on the base substrate, the substrate insulation layer being formed to expose the substrate connection terminal.

6. The method of claim 5, further comprising:
    forming a circuit metal pattern on the base substrate, wherein the substrate insulation layer includes the dummy opening and the dummy opening exposes the circuit metal pattern.

7. The method of claim 6, wherein the dummy opening has a greater width than a width of the circuit metal pattern.

8. The method of claim 5, further comprising:
    forming a via hole by patterning the base substrate; and
    forming a via metal pattern on a sidewall of the via hole, wherein the substrate insulation layer includes the dummy opening and the dummy opening exposes the via metal pattern.

9. The method of claim 5, further comprising:
    forming a recessed region in the base substrate; and
    forming a recess metal pattern covering a sidewall and a bottom of the recessed region,
    wherein the substrate insulation layer is formed to have a dummy opening exposing the recess metal pattern.

10. The method of claim 5, further comprising:
    forming a substrate dummy metal pattern on the base substrate, wherein the substrate insulation layer is formed to have the dummy opening and the dummy opening is formed to expose the substrate dummy metal pattern.

11. The method of claim 10, wherein the dummy opening is formed to have a width greater than a width of the substrate dummy metal pattern.

12. The method of claim 1, further comprising:
    forming an upper mixture layer on the first semiconductor chip;
    providing a second semiconductor chip on the upper mixture layer, the second semiconductor chip including an upper chip connection terminal and an upper chip insulation layer exposing the upper chip connection terminal; and
    forming an upper inner solder ball between the chip connection terminal and the upper chip connection terminal.

13. The method of claim 12, wherein the forming an inner solder ball and the forming of the upper inner solder ball are performed simultaneously.

14. A method of manufacturing a semiconductor package, the method comprising:
    forming at least one dummy opening in at least one of an insulation layer of a semiconductor chip and an insulation layer of a substrate;
    forming an inner solder ball between the substrate and the semiconductor chip, the inner solder ball electrically connecting a chip connecting terminal of the semiconductor chip to a substrate connection terminal of the substrate;
    forming a dummy solder in the at least one dummy opening, the dummy solder configured to be physically spaced apart from one of the substrate and the semiconductor chip.

15. The method of claim 14, further comprising:
    forming at least one of a circuit metal pattern, a via metal pattern, and a dummy substrate metal pattern on the substrate, wherein
    the at least one dummy opening is formed to expose at least one of the circuit metal pattern, the via metal pattern, and the dummy substrate metal pattern.

16. The method of claim 14, further comprising:
    forming a circuit metal pattern, a via metal pattern, and a dummy substrate metal pattern on the substrate, wherein
    the at least one dummy opening is a plurality of dummy openings formed to expose the circuit metal pattern, the via metal pattern, and the dummy substrate metal pattern.

17. The method of claim 14, further comprising:
    forming a mixture layer on the substrate, the mixture layer including an adhesive resin and a plurality of solder particles, wherein
    the inner solder ball and the dummy solder are simultaneously formed by heating the mixture layer.

18. The method of claim 17, wherein the solder particles are dispersed in the adhesive resin.

19. The method of claim 17, wherein the forming a mixture layer comprises providing a mixed multilayer including an adhesive resin layer formed of the adhesive resin and a solder particle layer formed of the solder particles.

* * * * *